(12) United States Patent
Kim et al.

(10) Patent No.: US 7,615,784 B2
(45) Date of Patent: *Nov. 10, 2009

(54) THIN FILM TRANSISTOR ARRAY PANEL AND MANUFACTURING METHOD THEREOF

(75) Inventors: Dong-Gyu Kim, Yongin (KR); Sang-Soo Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 39 days.

This patent is subject to a terminal disclaimer.

(21) Appl. No.: 11/680,733

(22) Filed: Mar. 1, 2007

(65) Prior Publication Data

US 2007/0138481 A1   Jun. 21, 2007

Related U.S. Application Data

(63) Continuation of application No. 10/619,668, filed on Jul. 15, 2003, now Pat. No. 7,205,570.

(30) Foreign Application Priority Data

Jul. 19, 2002  (KR) .............................. 20020042659
Nov. 5, 2002  (KR) .............................. 20020068107

(51) Int. Cl.
H01L 29/04  (2006.01)

(52) U.S. Cl. .......................... 257/59; 257/72

(58) Field of Classification Search ................. 257/72; 438/694

See application file for complete search history.

(56) References Cited

U.S. PATENT DOCUMENTS

| | | | |
|---|---|---|---|
| 5,986,738 A * | 11/1999 | Tagusa et al. ............... 349/138 |
| 6,087,678 A | 7/2000 | Kim | |
| 6,407,780 B1 * | 6/2002 | Sung ............................ 349/43 |
| 6,545,293 B2 | 4/2003 | Wong | |
| 6,713,786 B2 * | 3/2004 | Colgan et al. .................. 257/59 |
| 7,205,570 B2 * | 4/2007 | Kim et al. ..................... 257/72 |
| 2002/0053701 A1 * | 5/2002 | Kong et al. ................. 257/347 |
| 2002/0140895 A1 * | 10/2002 | Kimura et al. .............. 349/187 |
| 2007/0138474 A1 * | 6/2007 | Kim et al. ..................... 257/59 |

FOREIGN PATENT DOCUMENTS

| | | |
|---|---|---|
| KR | 1020000038604 A | 7/2000 |
| KR | 1020000040967 | 7/2000 |
| KR | 20020037845 | 5/2002 |
| KR | 1020020083249 | 11/2002 |
| KR | 1020030094606 | 12/2003 |

\* cited by examiner

*Primary Examiner*—Wai-Sing Louie
*Assistant Examiner*—Bilkis Jahan
(74) *Attorney, Agent, or Firm*—Cantor Colburn LLP

(57) ABSTRACT

Gate lines are formed on a substrate. A gate insulating layer, a semiconductor layer, an intrinsic a-Si layer, an extrinsic a-Si layer, a lower film of Cr and an upper film of Al containing metal are sequentially deposited, and the upper film and the lower film are patterned to form data lines and drain electrodes. A photoresist is formed, and the upper film is patterned using the photoresist as an etch mask to expose contact portions of the lower film of the drain electrodes. Exposed portions of the extrinsic a-Si layer and the intrinsic a-Si layer are removed, and then the photoresist and underlying portions of the extrinsic a-Si layer are removed. A passivation layer is formed and patterned along with the gate insulating layer to form contact holes exposing the contact portions of the lower film, and pixel electrodes are formed to contact the contact portions.

10 Claims, 44 Drawing Sheets

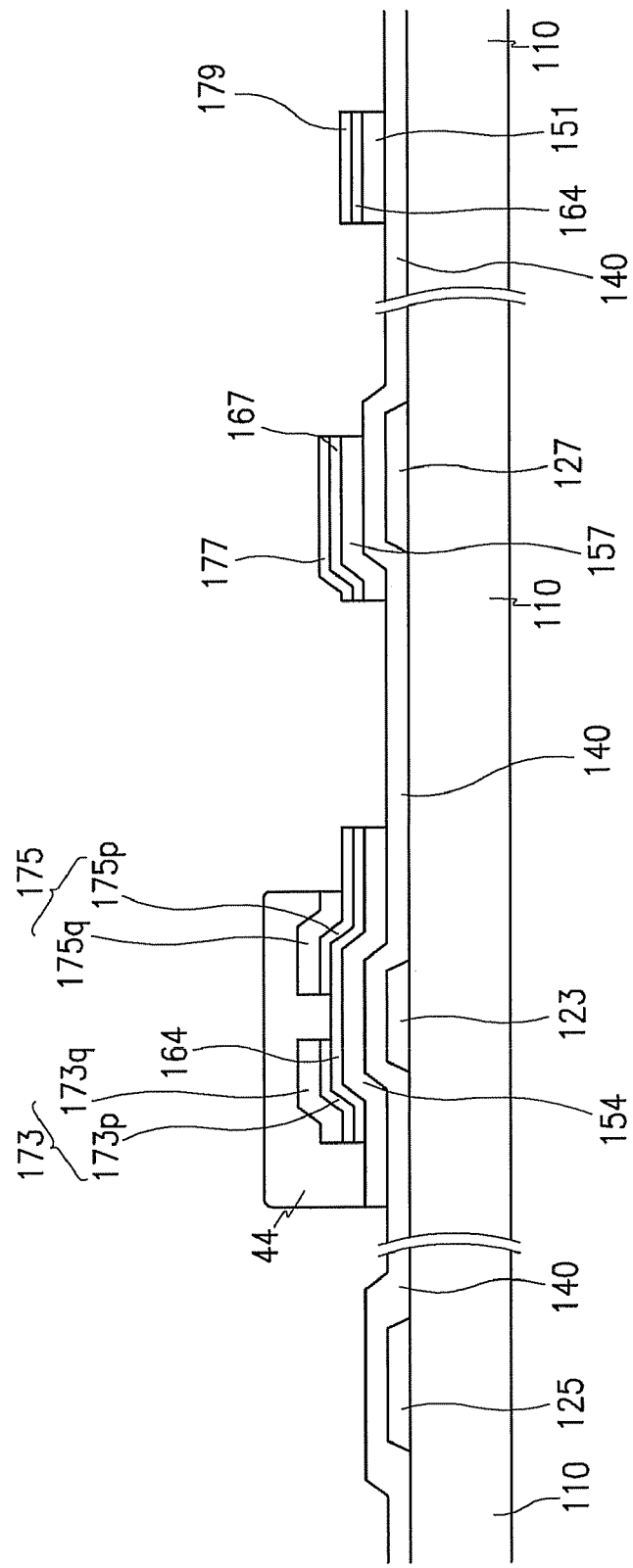

THIN FILM TRANSISTOR ARRAY PANEL AND MANUFACTURING METHOD THEREOF

CROSS REFERENCE TO RELATED APPLICATIONS

This application is a continuation application of U.S. application Ser. No. 10/619,668 filed Jul. 15, 2003, which claims priority to and the benefit of Korean Patent Application No. 2002-0042659 filed on Jul. 19, 2002 and Korean Patent Application No. 2002-0068107 filed on Nov. 5, 2002, all of which are incorporated by reference herein in their entirety.

BACKGROUND OF THE INVENTION (a) Field of the Invention

The present invention relates to a thin film transistor array panel and a manufacturing method thereof, and in particular, to a thin film transistor array panel for a liquid crystal display and a manufacturing method thereof.

(b) Description of the Related Art

Liquid crystal displays (LCDs) are one of the most widely used flat panel displays. An LCD includes two panels provided with field-generating electrodes and a liquid crystal (LC) layer interposed therebetween. The LCD displays images by applying voltages to the field-generating electrodes to generate an electric field in the LC layer, which determines orientations of LC molecules in the LC layer to adjust polarization of incident light.

Among LCDs including field-generating electrodes on respective panels, a kind of LCDs provides a plurality of pixel electrodes arranged in a matrix at one panel and a common electrode covering an entire surface of the other panel. The image display of the LCD is accomplished by applying individual voltages to the respective pixel electrodes. For the application of the individual voltages, a plurality of three-terminal thin film transistors (TFTs) are connected to the respective pixel electrodes, and a plurality of gate lines transmitting signals for controlling the TFTs and a plurality of data lines transmitting voltages to be applied to the pixel electrodes are provided on the panel.

The panel for an LCD has a layered structure including several conductive layers and several insulating layers. The gate lines, the data lines, and the pixel electrodes are made from different conductive layers (referred to as "gate conductor," "data conductor," and "pixel conductor" hereinafter) preferably deposited in sequence and separated by insulating layers. A TFT includes three electrodes: a gate electrode made from the gate conductor and source and drain electrodes made from the data conductor. The source electrode and the drain electrode are connected by a semiconductor usually located thereunder, and the drain electrode is connected to the pixel electrode through a hole in an insulating layer.

The gate conductor and the data conductor are preferably made of Al containing metal such as Al and Al alloy having low resistivity for reducing the signal delay in the gate lines and the data lines. The pixel electrodes are usually made of transparent conductive material such as indium tin oxide (ITO) and indium zinc oxide (IZO) for both the field generation upon voltage application and the light transmission.

In the meantime, the contact between Al containing metal and ITO or IZO causes several problems such as corrosion of the Al containing metal and the large contact resistance. In addition, the contact between Al containing metal and semiconductor such as silicon causes a diffusion problem. Accordingly, an additional metal having a good contact characteristic with ITO, IZO or semiconductor is interposed between Al containing metal and ITO, IZO and semiconductor in order for avoiding the direct contact therebetween. As a result, a data conductor, which is required to contact both semiconductor and pixel electrodes, having a dual-layered structure is suggested. The dual-layered structure includes an upper Al-containing metal layer and a lower metal layer and contact portions of the upper layer are removed for improved contacts with the overlying pixel electrodes.

As described above, a drain electrode and a pixel electrode are connected through a contact hole in an insulator. This connection is obtained by forming the hole in the insulator to expose a portion of an upper Al-containing metal layer of the drain electrode, removing the exposed portions of the upper metal layer by blanket-etching to expose a lower layer having good contact characteristic, and finally, forming the pixel electrode thereon. However, the blanket etch frequently generates undercut formed by over-etching the Al containing metal under a sidewall of the contact hole. The undercut yields disconnection or poor profile of the subsequently-formed pixel electrode near the undercut to increase the contact resistance between the pixel electrode and the drain electrode. An additional photo-etching step for removing the upper Al-containing metal layer is suggested but it increases complexity of a manufacturing process and a production cost.

SUMMARY OF THE INVENTION

A thin film transistor array panel is provided, which includes: a first conductive layer formed on an insulating substrate; a gate insulating layer on the first conductive layer; a semiconductor layer on the gate insulating layer; a second conductive layer formed at least in part on the semiconductor layer and including a data line and a drain electrode separated from each other, the second conductive layer including a lower film of barrier metal and an upper film of Al or Al alloy; a passivation layer covering the semiconductor layer; and a third conductive layer formed on the second conductive layer and contacting the second conductive layer, wherein at least an edge of the upper film lies on the lower film such that the lower film includes a first portion exposed out of the upper film, and the third conductive layer contacts the first portion of the lower film.

An edge of the upper film preferably traverses the lower film.

It is preferable that the passivation layer has a contact hole exposing the first portion of the lower layer at least in part, and at least a portion of the third conductive layer is located on the passivation layer. The at least an edge of the upper film may not coincide boundary of the contact hole. The passivation layer preferably contacts the lower film near the contact hole.

The lower film may include Cr, Mo or Mo alloy.

Preferably, the thin film transistor array panel further includes an ohmic contact interposed between the semiconductor layer and the second conductive layer, and the ohmic contact has substantially the same planar shape as the second conductive layer.

Preferably, the boundary of the semiconductor layer either substantially coincides with boundary of the second conductive layer or is located outside the second conductive layer.

The third conductive layer preferably includes ITO or IZO.

It is preferable that the third conductive layer comprises a pixel electrode contacting the drain electrode. The passivation layer has a first contact hole for contact between the drain electrode and the pixel electrode, a second contact hole exposing a portion of the first conductive layer, and a third contact hole exposing a portion of the data line, and the third conductive layer comprises a first contact assistant contacting the first conductive layer through the second contact hole and a second contact assistant contacting the data line through the third contact hole.

The first portion of the second conductive layer preferably has unevenness.

A method of manufacturing a thin film transistor array panel is provided, which includes: forming a gate conductive layer on an insulating substrate; forming a gate insulating layer; forming a semiconductor layer; forming a data conductive layer including a data line and a drain electrode separated from each other and a double-layered structure including a lower film and an upper film; removing a first portion of the upper film to expose a first portion of the lower film; and forming a pixel conductive layer contacting the first portion of the lower film, wherein the formation of the semiconductor layer is performed by using a photoresist and the removal of the first portion of the upper film is performed by using the photoresist as an etch mask.

Preferably, the lower film preferably includes a barrier metal, and the upper film includes Al or Al alloy.

The thin film transistor array panel may further include: forming an ohmic contact between the semiconductor layer and the data conductive layer.

The formation of the semiconductor layer and the data conductive layer may include: depositing an amorphous silicon layer; forming the data conductive layer on the amorphous silicon layer, the data conductive layer including the lower film and the upper film; coating a photoresist on the upper film and the amorphous silicon layer; removing a first portion of the upper film, the first portion being exposed out of the photoresist; and forming the semiconductor layer including the amorphous silicon layer by removing portions of the amorphous silicon layer exposed out of the data conductive layer and the photoresist.

It is preferable that the first portion of the upper film is not covered with the photoresist, the semiconductor layer includes a channel portion located between the data line and the drain electrode, and the photoresist covers the channel portion.

The amorphous silicon layer preferably includes an intrinsic amorphous silicon film and an extrinsic amorphous silicon film on the intrinsic amorphous silicon film. The method further includes: removing the photoresist after the formation of the semiconductor layer; and removing portions of the extrinsic amorphous silicon film exposed out of the data conductive layer.

The method may further include: leaving an island-like portion of the upper film on the lower film; and removing the island-like portion of the upper film by blanket etch.

A thin film transistor array panel is provided, which includes: a gate conductive layer formed on an insulating substrate; a gate insulating layer on the gate conductive layer; a semiconductor layer on the gate insulating layer; a data conductive layer formed at least in part on the semiconductor layer and including a data line and a drain electrode separated from each other; a passivation layer covering the semiconductor layer; and a pixel electrode contacting the drain electrode, wherein boundary of the semiconductor layer is exposed out of the data line except for places near the drain electrode and an end portion of the data line.

The data conductive layer preferably has a multilayered structure including a lower film and an upper film, and the lower film and the upper film have different shapes.

The lower film preferably includes a barrier metal and the upper film comprises Al or Al alloy.

The data line preferably has an edge substantially parallel to the semiconductor layer, and the edge of the data line is either placed on the semiconductor layer or coinciding with an edge of the semiconductor layer.

The pixel electrode preferably has an edge overlapping the gate conductive layer, the data conductive layer, or the semiconductor layer.

Preferably, the thin film transistor array panel further includes an ohmic contact interposed between the semiconductor layer and the data conductive layer and having substantially the same planar shape as the data conductive layer.

A lateral side of the data conductive layer is preferably tapered.

The passivation layer preferably has a first contact hole for contact between the drain electrode and the pixel electrode, a second contact hole exposing a portion of the gate conductive layer, and a third contact hole exposing a portion of the data line. The thin film transistor array panel further includes a first contact assistant contacting the gate conductive layer through the second contact hole and a second contact assistant contacting the data line through the third contact hole, the first and the second contact including the same layer as the pixel electrode.

The passivation layer preferably contacts the lower film near the first and the second contact holes.

A portion of the drain electrode contacting the pixel electrode preferably has unevenness.

A method of manufacturing a thin film transistor array panel is provided, which includes: forming a gate line on an insulating substrate; forming a gate insulating layer on the gate line; forming a semiconductor layer on the gate insulating layer; forming a data conductive layer including a data line intersecting the gate line and a drain electrode separated from the data line; forming a pixel conductive layer contacting the drain electrode, wherein the formation of the semiconductor layer is performed by using a photoresist as an etch mask and the photoresist does not cover a portion of the data conductive layer.

The data line and the drain electrode preferably include a lower film and an upper film. The method further includes: removing the uncovered portion of the upper film.

The formation of the semiconductor layer and the data conductive layer includes: depositing an amorphous silicon layer; forming the data conductive layer on the amorphous silicon layer, the data conductive layer including the lower film and the upper film; forming the photoresist on the upper film and the amorphous silicon layer; removing the uncovered portion of the upper film; and forming the semiconductor layer including the amorphous silicon layer by removing portions of the amorphous silicon layer exposed out of the data conductive layer and the photoresist.

The method may further include: leaving an island-like portion of the upper film on the lower film; and removing the island-like portion of the upper film by blanket etch.

The semiconductor layer preferably includes a channel portion located between the data line and the drain electrode and the photoresist covers the channel portion.

BRIEF DESCRIPTION OF THE DRAWINGS

The above and other advantages of the present invention will become more apparent by describing preferred embodiments thereof in detail with reference to the accompanying drawings in which:

FIG. 12B is a sectional view of the TFT array panel shown in FIG. 12A taken along the lines XIIB-XIIB', which illustrates the step following the step shown in FIG. 11B;

DETAILED DESCRIPTION OF PREFERRED EMBODIMENTS

Figure 1:
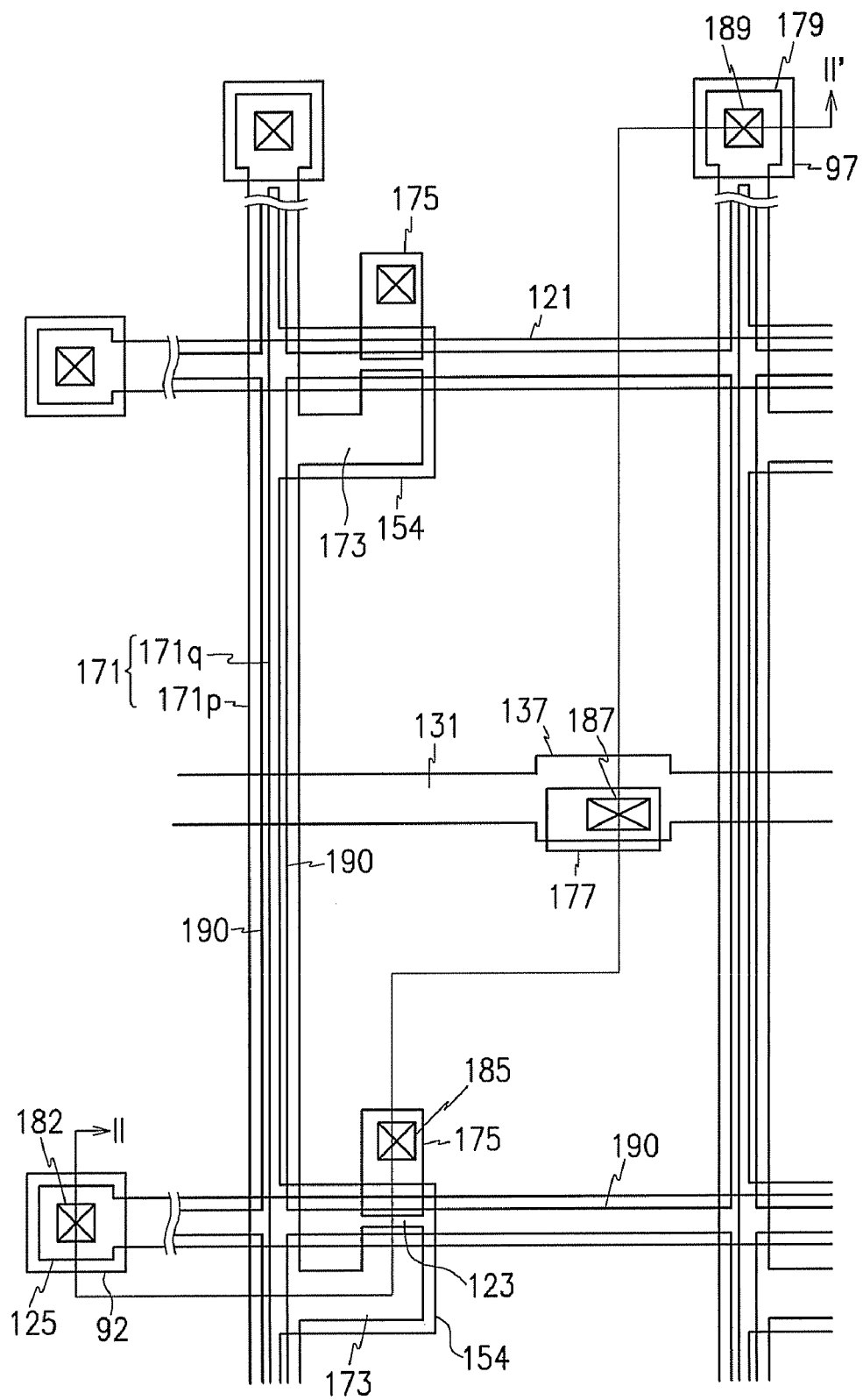
FIG. 1 is a layout view of an exemplary TFT array panel for an LCD according to an embodiment of the present invention.

The present invention now will be described more fully hereinafter with reference to the accompanying drawings, in which preferred embodiments of the invention are shown. The present invention may, however, be embodied in many different forms and should not be construed as limited to the embodiments set forth herein.

In the drawings, the thickness of layers, films, panels, regions, etc. are exaggerated for clarity. Like numerals refer to like elements throughout. It will be understood that when an element such as a layer, film, region or substrate is referred to as being "on" another element, it can be directly on the other element or intervening elements may also be present. In contrast, when an element is referred to as being "directly on" another element, there are no intervening elements present.

Now, TFT array panels including contact structures and manufacturing methods thereof according to embodiments of the present invention will be described with reference to the accompanying drawings.

A TFT array panel for an LCD according to an embodiment of the present invention will be described in detail with reference to FIGS. 1 and 2.

Figure 2:
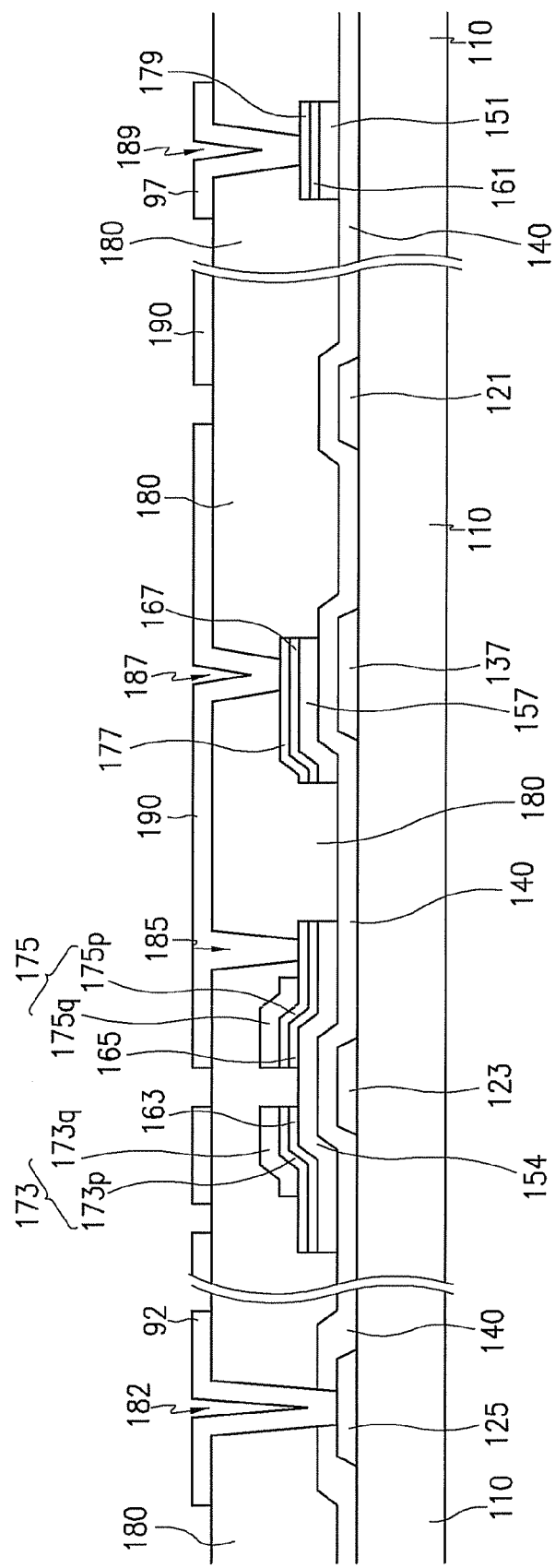
FIG. 2 is a sectional view of the TFT array panel shown in FIG. 1 taken along the line II-II'.

FIG. 1 is a layout view of an exemplary TFT array panel for an LCD according to an embodiment of the present invention, and FIG. 2 is a sectional view of the TFT array panel shown in FIG. 1 taken along the line II-II'.

A plurality of gate lines 121 and a plurality of storage electrode lines 131 are formed on an insulating substrate 110.

The gate lines 121 and the storage electrode lines 131 extend substantially in a transverse direction and are separated from each other. The gate lines 121 transmit gate signals and a plurality of portions of each gate line 121 form a plurality of gate electrodes 123. The storage electrode lines 131 are supplied with a predetermined voltage such as a common voltage, which is applied to a common electrode (not shown) on the other panel (not shown) of the LCD. Each storage electrode line 131 includes a plurality of expansions 137 protruding upward and downward.

The gate lines 121 and the storage electrode lines 131 include a low resistivity conductive layer preferably made of Ag containing metal such as Ag and Ag alloy or Al containing metal such as Al and Al alloy. The gate lines 121 and the storage electrode lines 131 may have a multilayered structure including a low resistivity conductive layer and another layer preferably made of Cr, Ti, Ta, Mo or their alloys such as MoW alloy having good physical, chemical and electrical contact characteristics with other materials such as ITO and IZO. A good exemplary combination of such layers is Cr and Al—Nd alloy.

The lateral sides of the gate lines 121 and the storage electrode lines 131 are tapered, and the inclination angle of the lateral sides with respect to a surface of the substrate 110 ranges about 30-80 degrees.

A gate insulating layer 140 preferably made of silicon nitride (SiNx) is formed on the gate lines 121 and the storage electrode lines 131.

A plurality of semiconductor stripes and islands 151 and 157 preferably made of hydrogenated amorphous silicon (abbreviated to "a-Si") are formed on the gate insulating layer 140. Each semiconductor stripe 151 extends substantially in a longitudinal direction and has a plurality of extensions 154 branched out toward the gate electrodes 123.

A plurality of ohmic contact, stripes and islands 161, 165 and 167 preferably made of silicide or n+ hydrogenated a-Si heavily doped with n type impurity are formed on the semiconductor stripes and islands 151 and 157, Each ohmic contact stripe 161 has a plurality of extensions 163, and the extensions 163 and the ohmic contact islands 165 are located in pairs on the extensions 154 of the semiconductor stripes 151. The ohmic contact islands 167 are placed on the semiconductor islands 157.

The lateral sides of the semiconductor stripes and islands 151 and 157 and the ohmic contacts 161, 165 and 167 are tapered, and the inclination angles thereof are preferably in a range between about 30-80 degrees.

A plurality of data lines 171, a plurality of drain electrodes 175, and a plurality of storage capacitor conductors 177 are formed on the ohmic contacts 161, 165 and 167, respectively.

The data lines 171 for transmitting data voltages extend substantially in the longitudinal direction and intersect the gate lines 121. A plurality of branches of each data line 171, which extend toward the drain electrodes 175, form a plurality of source electrodes 173. Each pair of the source electrodes 173 and the drain electrodes 175 are separated from each other and opposite each other with respect to a gate electrode 123. A gate electrode 123, a source electrode 173, and a drain electrode 175 along with an extension 154 of a semiconductor stripe 151 form a TFT having a channel formed in the extension 154 disposed between the source electrode 173 and the drain electrode 175.

The storage capacitor conductors 177 overlap the expansions 137 of the storage electrode lines 131. The storage capacitor conductors 177 may extend to the drain electrodes 175 to be connected thereto.

The data lines 171 include two films having different physical characteristics, a lower film 171p and an upper film 171q. The upper film 171q is preferably made of low resistivity metal such as Al containing metal for reducing signal delay or voltage drop in the data lines 171. On the other hand, the lower film 171p is preferably made of material having good physical, chemical and electrical contact characteristics with other materials such as ITO and IZO. Exemplary materials for the lower film 171p are Cr, Ti, Ta, Mo and their alloys such as MoW alloy, and they also serve as a diffusion barrier between a-Si and Al. Contact portions of the data lines 171, i.e., end portions 179 include only a lower film without an upper film.

Like the data lines 171, the drain electrodes 175 and the storage capacitor conductors 177 may also have a double-layered structure except for contact portions. FIG. 2 shows dual-layered drain electrodes 175; 175p and 175q and single-layered storage capacitor conductors 177.

The edges of the data lines 171, the drain electrodes 175, and the storage capacitor electrodes 177 have tapered lateral sides and the inclination angles thereof range about 30-80 degrees.

The ohmic contacts 161, 165 and 167 interposed only between the underlying semiconductor stripes and islands 151 and 157 and the overlying data lines 171, the overlying drain electrodes 175 and the overlying conductors 177, and reduce the contact resistance therebetween. The semiconductor stripes and islands 151 and 157 have almost the same planar shapes as the data lines 171, the drain electrodes 175 and the storage capacitor conductors 177 as well as the underlying ohmic contacts 161, 165 and 167, except for the extensions 154 where TFTs are provided. In particular, the semiconductor islands 157, the ohmic contact islands 167 and the storage conductors 177 have substantially the same planar shape. The semiconductor stripes 151 include some exposed portions, which are not covered with the data lines 171, the drain electrodes 175 and the storage conductors 177, such as portions located between the source electrodes 173 and the drain electrodes 175.

A passivation layer 180 is formed on the data lines 171, the drain electrodes 175, the storage conductors 177, and the exposed portions of the semiconductor stripes 151. The passivation layer 180 is preferably made of photosensitive organic material having a good flatness characteristic, low dielectric insulating material such as a-Si:C:O and a-Si:O:F formed by plasma enhanced chemical vapor deposition (PECVD), or inorganic material such as silicon nitride.

The passivation layer 180 has a plurality of contact holes 185, 187 and 189 exposing the drain electrodes 175, the storage conductors 177, and the end portions 179 of the data lines 171, respectively. The passivation layer 180 and the gate insulating layer 140 has a plurality of contact holes 182 exposing end portions 125 of the gate lines 121.

As described above, the contact holes 185 and 189 expose the lower film of the drain electrodes 175 and the end portions 179 of the data lines 171, respectively. In addition, the contact holes 182, 185, 187 and 189 have no undercut and are small enough to expose no edge of the gate lines 121, the drain electrodes 185, the storage capacitor conductors 177, and the date lines 171. The boundaries of the contact holes 185 and 189 do not match the boundaries of the upper films 175p and 171q.

A plurality of pixel electrodes 190 and a plurality of contact assistants 92 and 97, which are preferably made of IZO or ITO, are formed on the passivation layer 180.

The pixel electrodes 190 are physically and electrically connected to the drain electrodes 175 through the contact holes 185 and to the storage capacitor conductors 177 through the contact holes 187 such that the pixel electrodes 190 receive the data voltages from the drain electrodes 175 and transmit the received data voltages to the storage capacitor conductors 177. The pixel electrodes 190 supplied with the data voltages generate electric fields in cooperation with the common electrode on the other panel, which reorient liquid crystal molecules disposed therebetween.

A pixel electrode 190 and a common electrode form a capacitor called a "liquid crystal capacitor," which stores applied voltages after turn-off of the TFT. An additional capacitor called a "storage capacitor," which is connected in parallel to the liquid crystal capacitor, is provided for enhancing the voltage storing capacity. The storage capacitors are implemented by overlapping the pixel electrodes 190 with the storage electrode lines 131. The capacitances of the storage capacitors, i.e., the storage capacitances are increased by providing the expansions 137 at the storage electrode lines 131 for increasing overlapping areas and by providing the storage capacitor conductors 177, which are connected to the pixel electrodes 190 and overlap the expansions 137, under the pixel electrodes 190 for decreasing the distance between the terminals.

The pixel electrodes 190 overlap the gate lines 121 and the data lines 171 to increase aperture ratio but it is optional.

The contact assistants 92 and 97 are connected to the exposed end portions 125 of the gate lines 121 and the exposed end portions 179 of the data lines 171 through the contact holes 182 and 189, respectively. The contact assistants 92 and 97 are not requisites but preferred to protect the exposed portions 125 and 179 and to complement the adhesiveness of the exposed portion 125 and 179 and external devices.

As described above, the contact holes 185, 187 and 189 exposes the lower film of the drain electrodes 175, the storage capacitor electrodes 177, and the data lines 171, while the lower film has a good contact characteristic, and the pixel electrodes 190 and the contact assistants 92 and 97 made of IZO or ITO contact only the lower film. Accordingly, the contact resistance therebetween is reduced and thus the characteristics of the LCD are improved.

According to another embodiment of the present invention, the pixel electrodes 190 are made of transparent conductive polymer. For a reflective LCD, the pixel electrodes 190 are made of opaque reflective metal. In these cases, the contact assistants 92 and 97 may be made of material such as IZO or ITO different from the pixel electrodes 190.

A method of manufacturing the TFT array panel shown in FIGS. 1 and 2 according to an embodiment of the present invention will be now described in detail with reference to FIGS. 3A to 7B as well as FIGS. 1 and 2.

FIGS. 3A, 4A, 5A and 7A are layout views of the TFT array panel shown in FIGS. 1 and 2 in intermediate steps of a manufacturing method thereof according to an embodiment of the present invention; FIG. 3B is a sectional view of the TFT array panel shown in FIG. 3A taken along the lines IIIB-IIIB'; FIG. 4B is a sectional view of the TFT array panel shown in FIG. 4A taken along the lines IVB-IVB', which illustrates the step following the step shown in FIG. 3B; FIG. 5B is a sectional view of the TFT array panel shown in FIG. 5A taken along the lines VB-VB', which illustrates the step following the step shown in FIG. 4B; FIG. 6 is a sectional view of the TFT array panel shown in FIG. 5A taken along the lines VB-VB', which illustrates the step following the step shown in FIG. 5B; and FIG. 7B is a sectional view of the TFT array panel shown in FIG. 7A taken along the lines VIIB-VIIB', which illustrates the step following the step shown in FIG. 6.

Figure 3A:
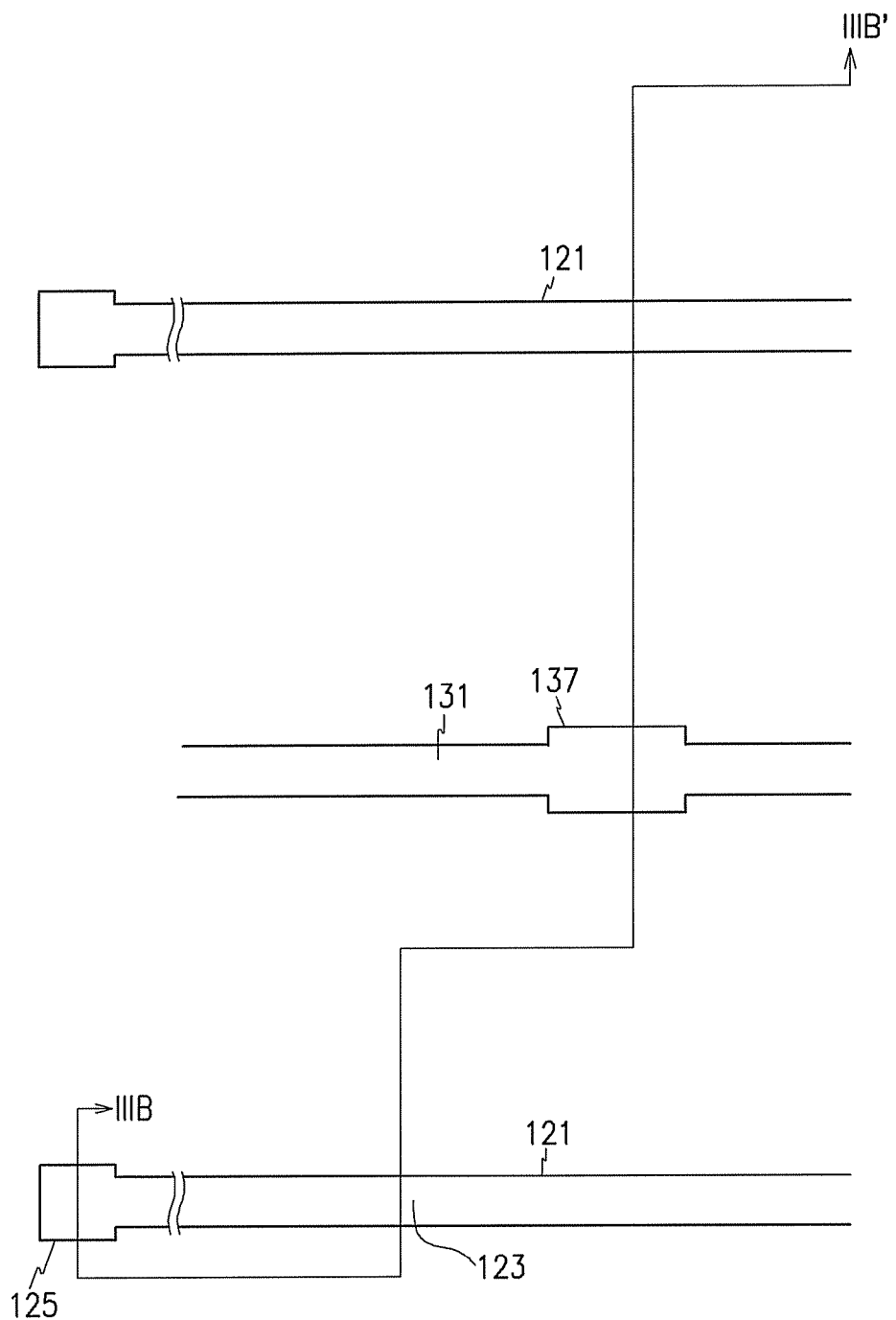
FIGS. 3A, 4A, 5A and 7A are layout views of the TFT array panel shown in FIGS. 1 and 2 in intermediate steps of a manufacturing method thereof according to an embodiment of the present invention.
Figure 3B:
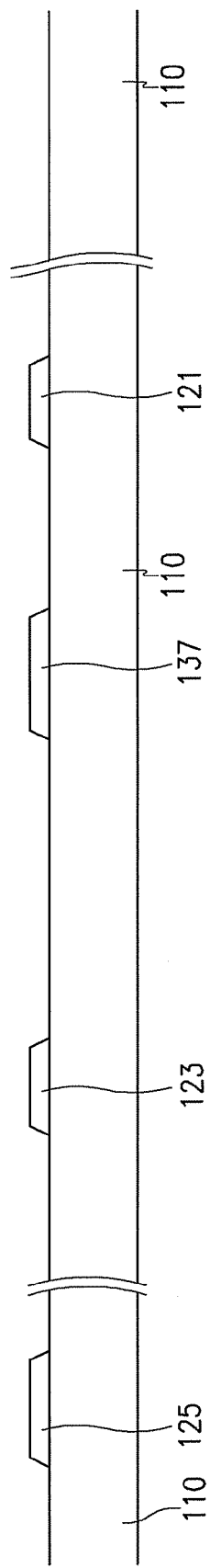
FIG. 3B is a sectional view of the TFT array panel shown in FIG. 3A taken along the lines IIIB-IIIB'.

Referring to FIGS. 3A and 3B, a plurality of gate lines 121 including a plurality of gate electrodes 123 and a plurality of storage electrode lines 131 including a plurality of expansions 137 are formed by photo etching on an insulating substrate 110 such as transparent glass.

A gate insulating layer 140, an intrinsic a-Si layer 150, and an extrinsic a-Si layer 160 are sequentially deposited by CVD. The gate insulating layer 140 is preferably made of silicon nitride with thickness of about 2,000 Å to about 5000 Å, and the deposition temperature is preferably in a range between about 250° C. and about 400° C.

Two conductive films, a lower conductive film and an upper conductive film are sputtered in sequence on the extrinsic a-Si layer 160. The lower conductive film is preferably made of Mo, Mo alloy or Cr having a good contact characteristic with IZO and ITO, and preferably has a thickness of about 500 Å. It is preferable that the upper conductive film has a thickness of about 2,500 Å, the sputtering target for the upper conductive film includes pure Al or Al—Nd containing 2 atomic % Nd, and the sputtering temperature is about 150° C.

Figure 4A:
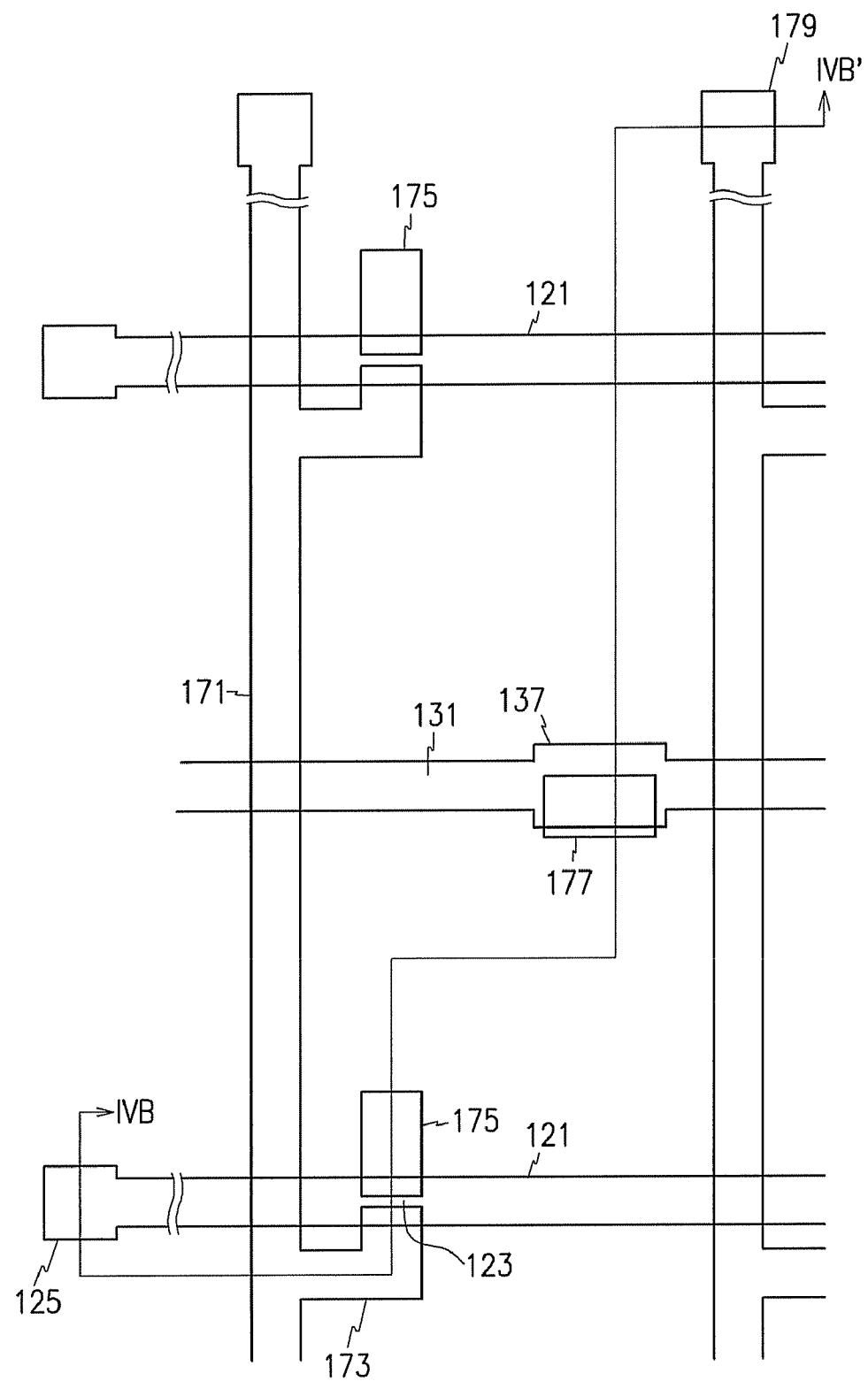
Figure 4B:
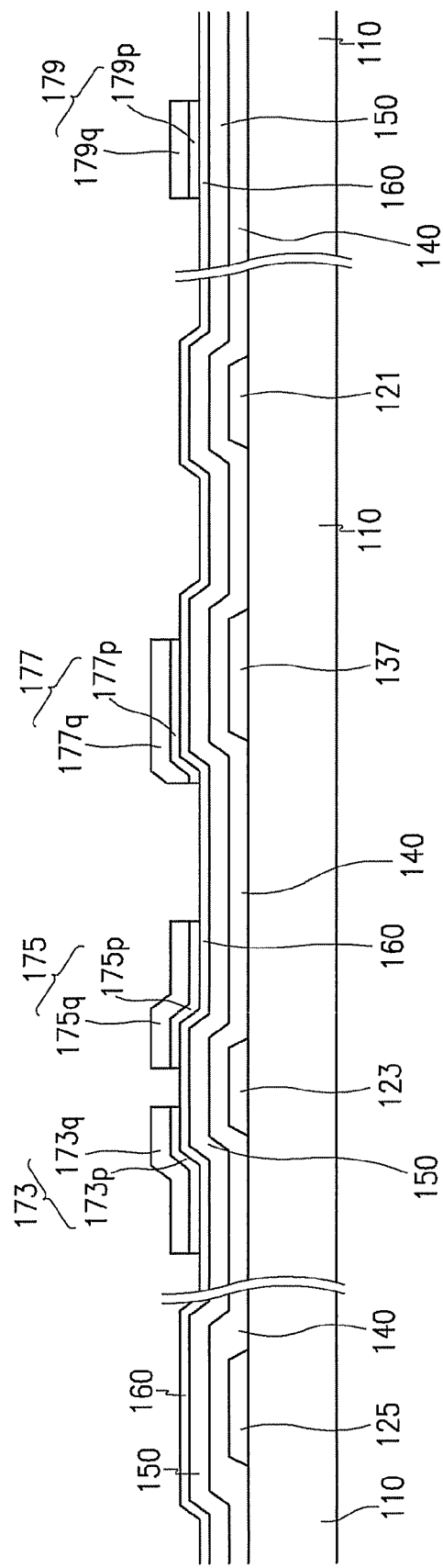
FIG. 4B is a sectional view of the TFT array panel shown in FIG. 4A taken along the lines IVB-IVB', which illustrates the step following the step shown in FIG. 3B.

Referring to FIGS. 4A and 4B, the upper conductive film and the lower conductive film are photo-etched to form a plurality of data lines 171 including a plurality of source electrodes 173, a plurality of drain electrodes 175, and a plurality of storage capacitor conductors 177, which have double-layered structures including a lower film 171p, 175p and 177p and an upper film 171q, 175q and 177q. Any etching types can be applicable to the lower conductive film and the upper conductive film. For example, either any one of the wet etching and the dry etching can be applied to both the upper film and the lower film, or the wet etching is applied to any one of the upper and the lower films while the dry etching is the other of the upper and the lower films. An upper film of Al containing metal and a lower film of Mo or Mo alloy can be etched under the same etching condition.

Figure 5A:
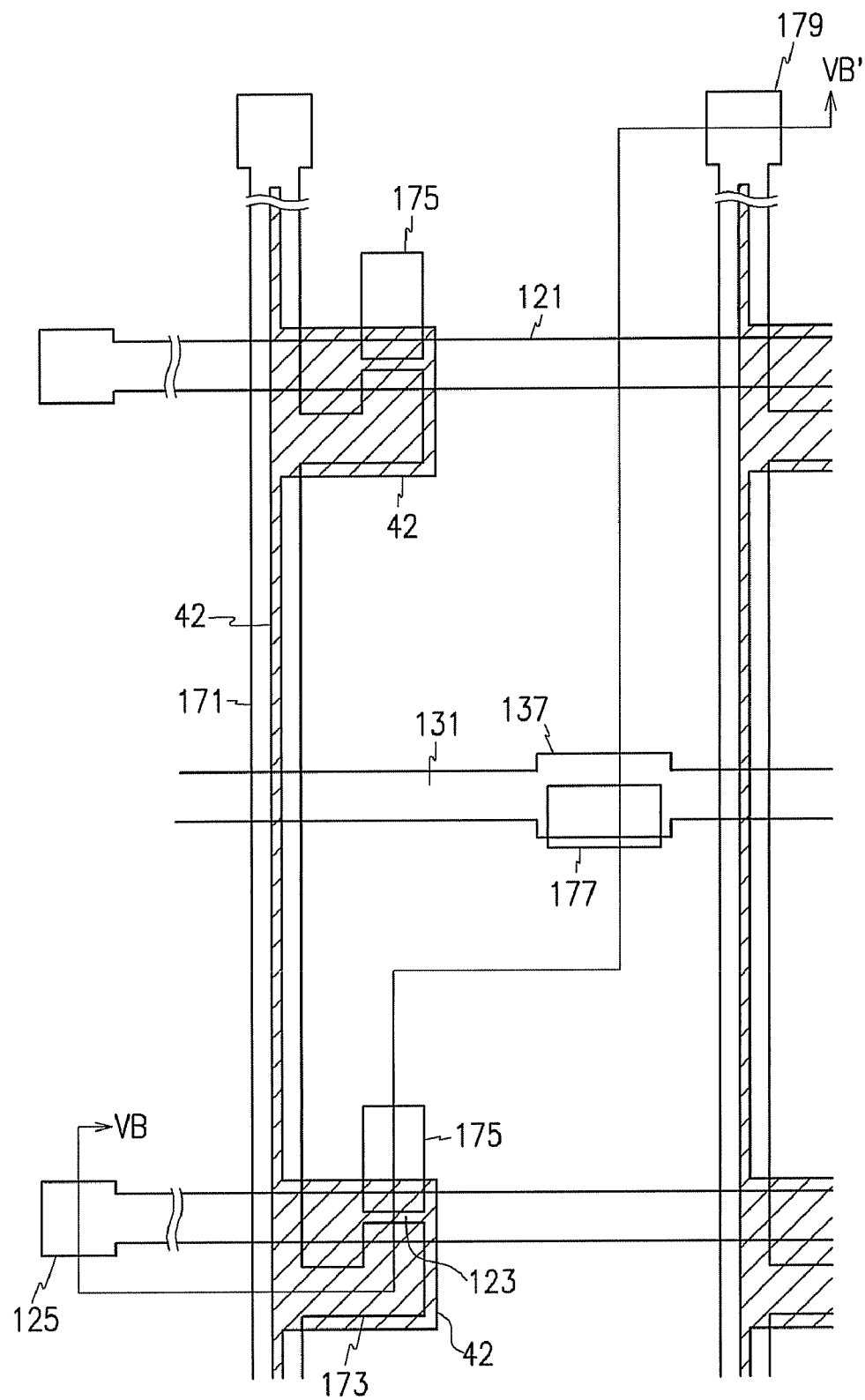
Figure 5B:
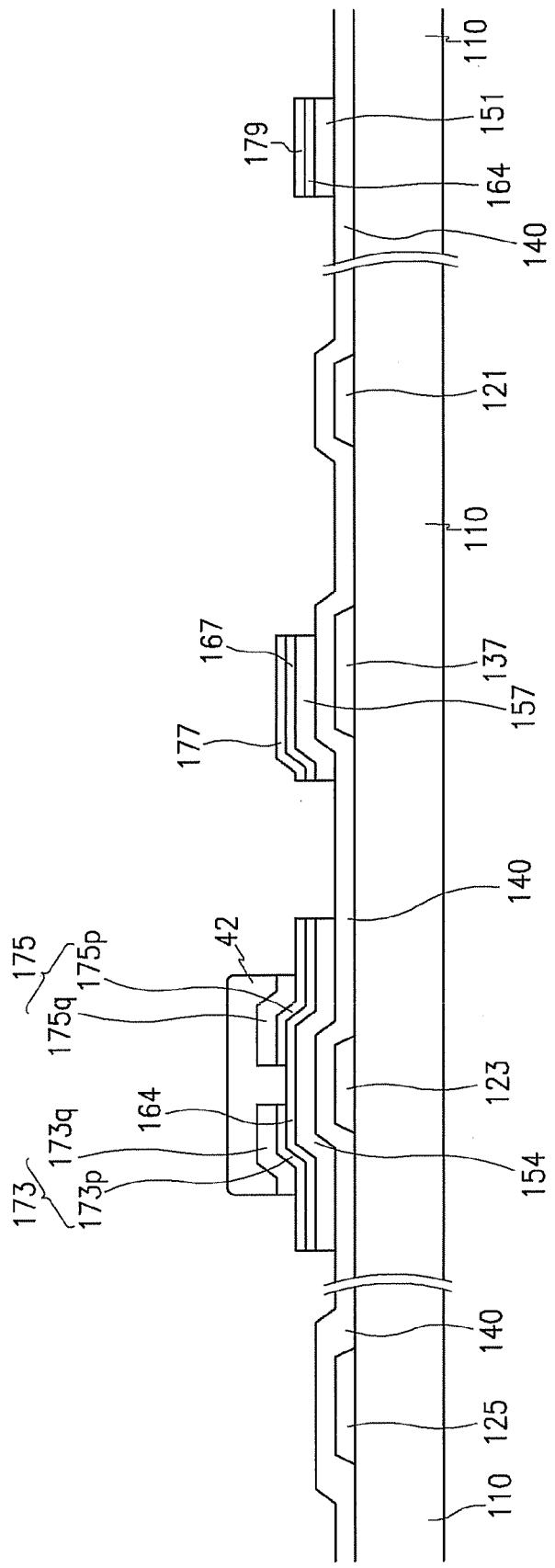
FIG. 5B is a sectional view of the TFT array panel shown in FIG. 5A taken along the lines VB-VB', which illustrates the step following the step shown in FIG. 4B.
Figure 6:
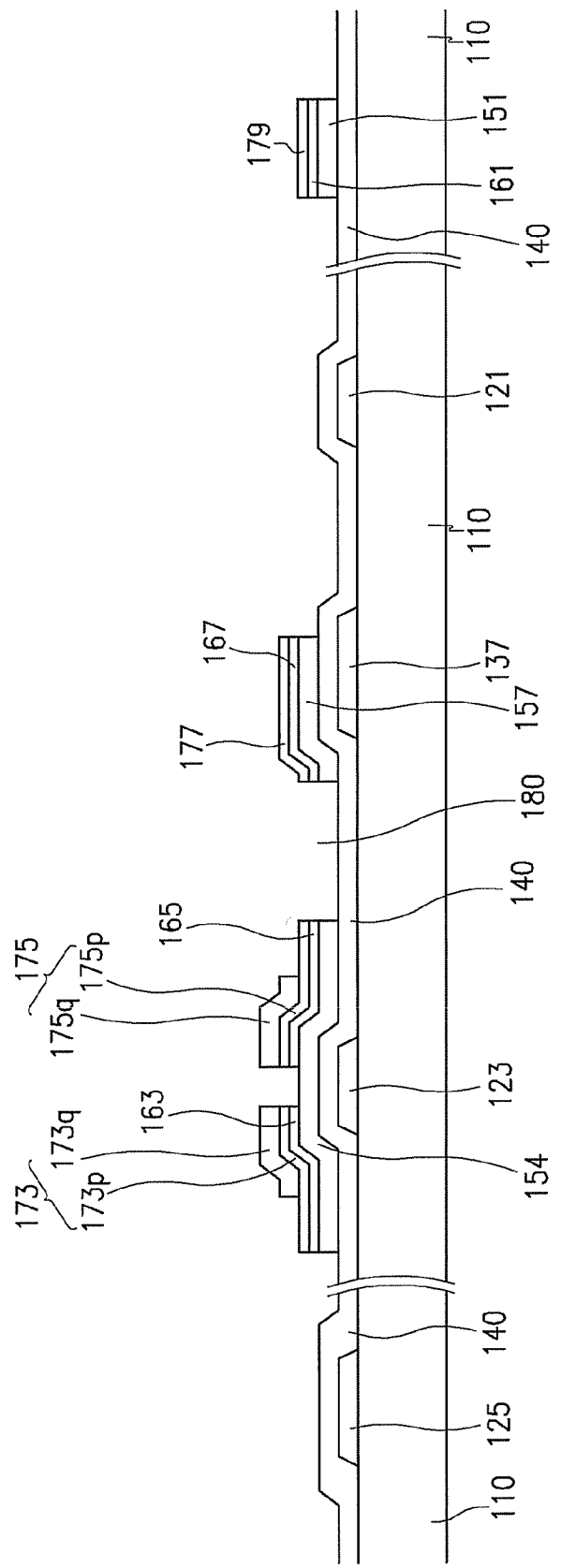
FIG. 6 is a sectional view of the TFT array panel shown in FIG. 5A taken along the lines VB-VB', which illustrates the step following the step shown in FIG. 5B.

A photoresist 42 is formed as shown in FIGS. 5A and 5B. The photoresist 42 does not cover contact portions of the data lines 171, the drain electrodes 175, and the storage capacitor electrodes 177, while it covers portions of the extrinsic a-Si layer 160 located between the source electrodes 173 and the drain electrodes 175. The exposed portions of the upper film 171q, 175q and 177q are etched out using the photoresist 42 as an etch mask.

The extrinsic a-Si layer 160 and the intrinsic a-Si layer 150 are etched using the photoresist 42 as well as the data lines 171, the drain electrodes 175, and the storage capacitor conductors 177 as an etch mask to form a plurality of extrinsic semiconductor stripes and islands 164 and 167 and a plurality of intrinsic semiconductor stripes and islands 151 and 157. The intrinsic semiconductor stripes 151 include a plurality of extensions 154 and have areas larger than the data lines 171 and the drain electrodes 175.

After removing the photoresist 42, exposed portions of the extrinsic semiconductor stripes 164 are removed to complete a plurality of ohmic contact stripes and islands 161, 165 and 167 and to expose portions of the intrinsic semiconductor stripes 151, as shown in FIG. 6. Oxygen plasma treatment preferably follows thereafter in order to stabilize the exposed surfaces of the semiconductor stripes 151.

To summarize, the process steps shown in FIGS. 5A to 6 complete the semiconductor stripes and islands 151 and 157 and selectively remove the upper film of the data lines 171, et al. by using only one photolithography step.

Figure 7A:
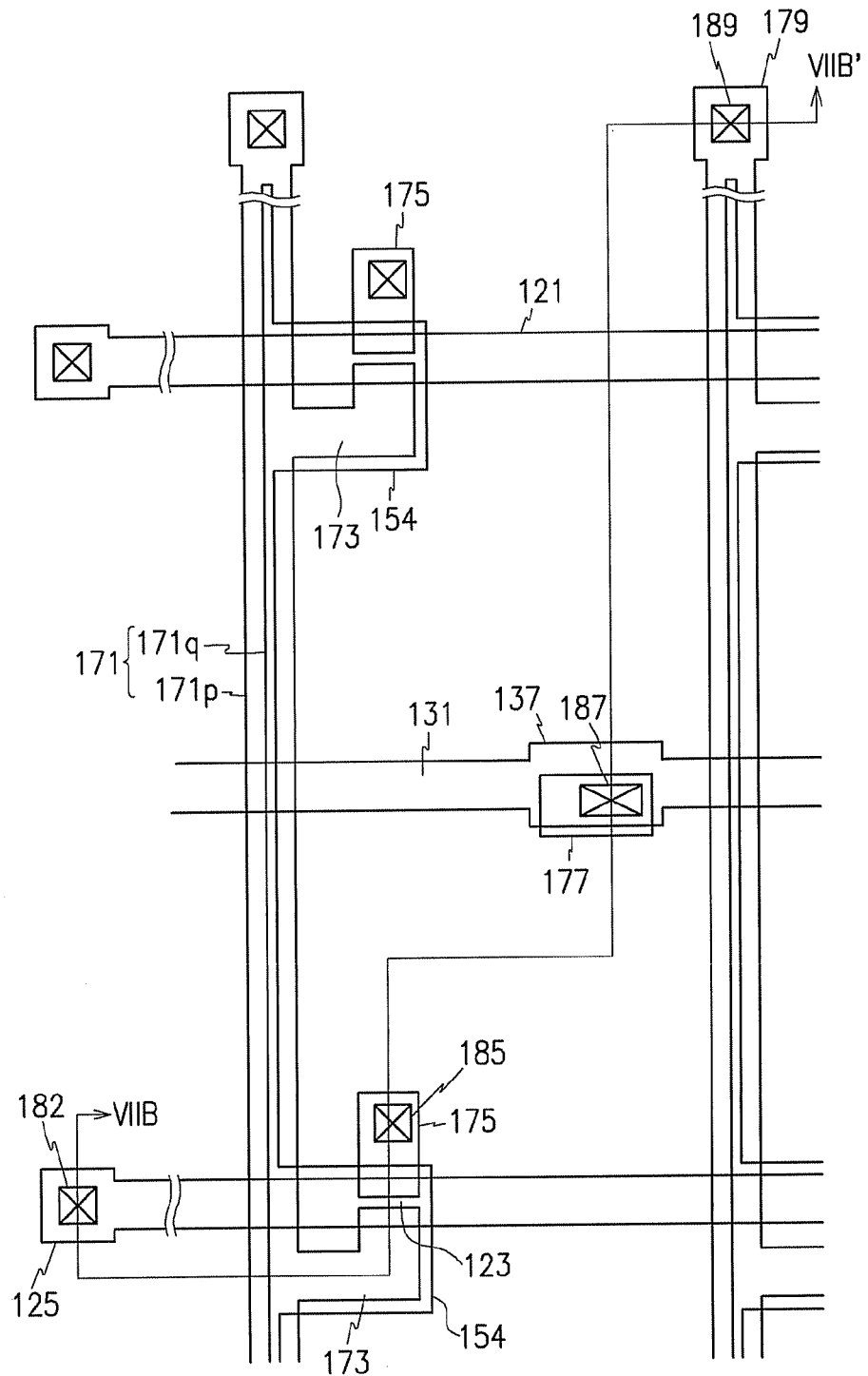
Figure 7B:
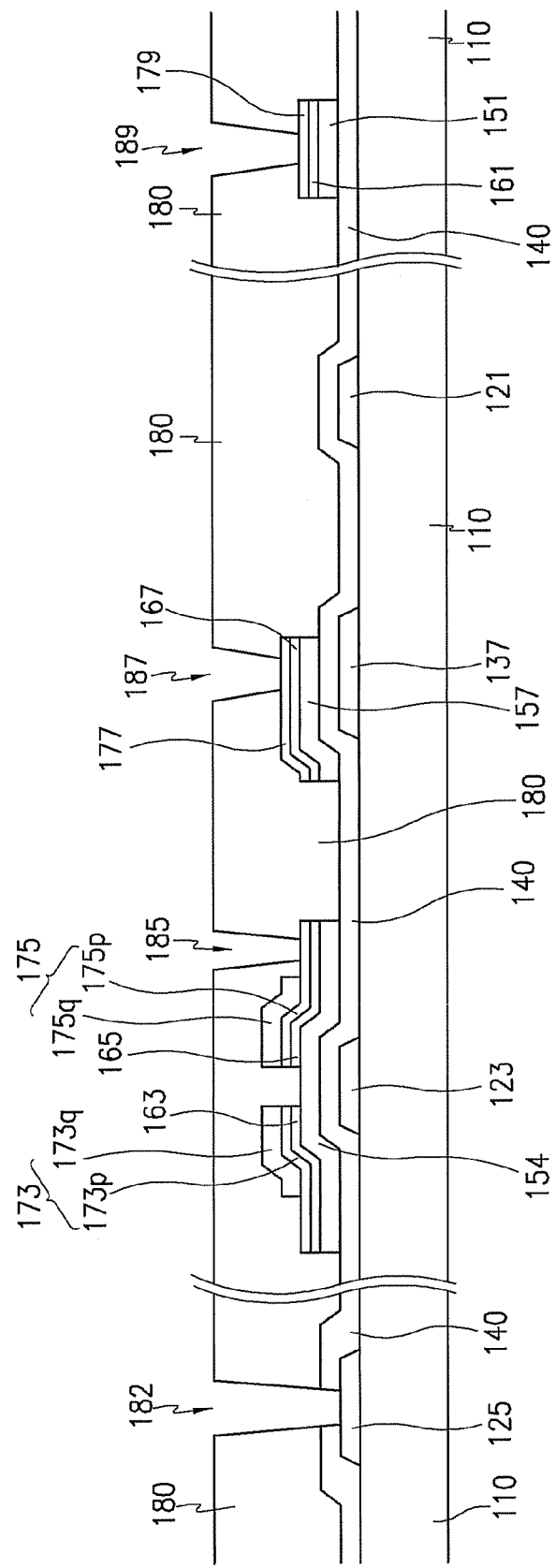
FIG. 7B is a sectional view of the TFT array panel shown in FIG. 7A taken along the lines VIIB-VIIB', which illustrates the step following the step shown in FIG. 6.

As shown in FIGS. 7A and 7B, after depositing a passivation layer 180, the passivation layer 180 and the gate insulating layer 140 are dry-etched using photolithography to form a plurality of contact holes 182, 185, 187 and 189 exposing end portions 125 of the gate lines 121, the drain electrodes 175, the storage capacitor conductors 177, and end portions 179 of the data lines 171, respectively.

Although the conventional technique requires removal of exposed portions of the upper film after formation of the contact holes 182, 185, 187 and 189, this embodiment does not require such as step since it exposes no upper film through the contact holes 182, 185, 187 and 189. Accordingly, there is no undercut in the contact holes 182, 185, 187 and 189, which in turn have smooth profiles across the side walls and the bottom.

Finally, as shown in FIGS. 1 and 2, a plurality of pixel electrodes 190 and a plurality of contact assistants 92 and 97 are formed on the passivation layer 180 by sputtering and photo-etching an IZO layer or an ITO layer. An example of sputtering target for the IZO layer is IDIXO (indium x-metal oxide) produced by Idemitsu Co. of Japan. The sputtering target includes $In_2O_3$ and ZnO, and the ratio of Zn with respect to the sum of Zn and In is preferably in a range of about 15-20 atomic %. The preferred sputtering temperature for minimizing the contact resistance is equal to or lower than about 250° C.

As shown in FIG. 2, the pixel electrodes 190 and the contact assistants 92 and 97 extend along the sidewalls and the bottoms of the contact holes 182, 185, 187 and 189, which exhibit smooth profiles, and also have smooth profiles without disconnection or distortion.

In the TFT array panel according to an embodiment of the present invention, the gate lines 121 and the data lines 171 include Al or Al alloy with low resistivity while they have reduced contact resistance between the IZO or ITO pixel electrodes 190. Moreover, the Al containing metal layer is removed at the contact portions during the formation of the semiconductor stripes and islands 151 and 157 without an additional photo etching step, thereby simplifying the manufacturing process.

A TFT array panel for an LCD according to another embodiment of the present invention will be described in detail with reference to FIGS. 8 and 9.

Figure 8:
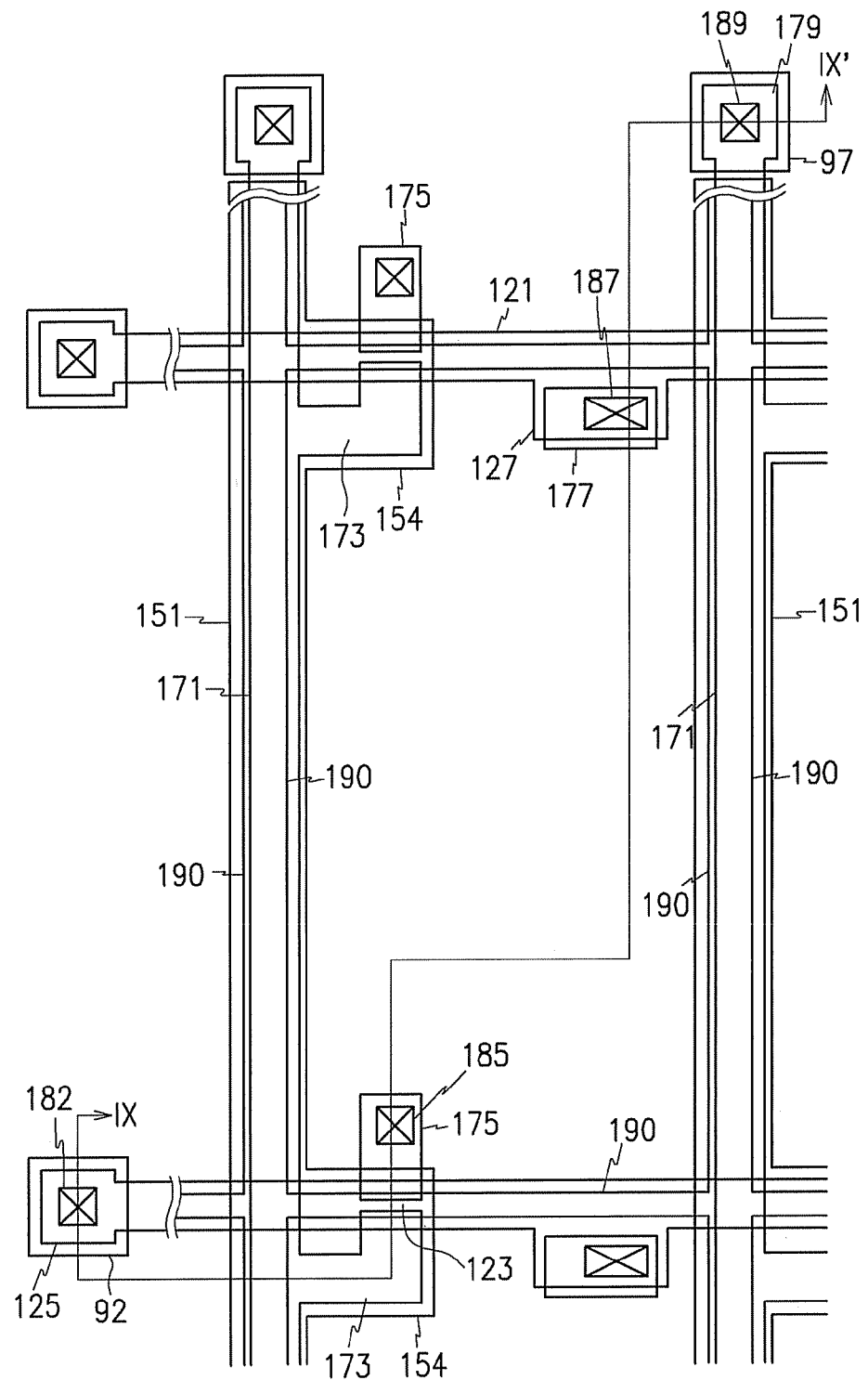
FIG. 8 is a layout view of an exemplary TFT array panel for an LCD according to another embodiment of the present invention.
Figure 9:
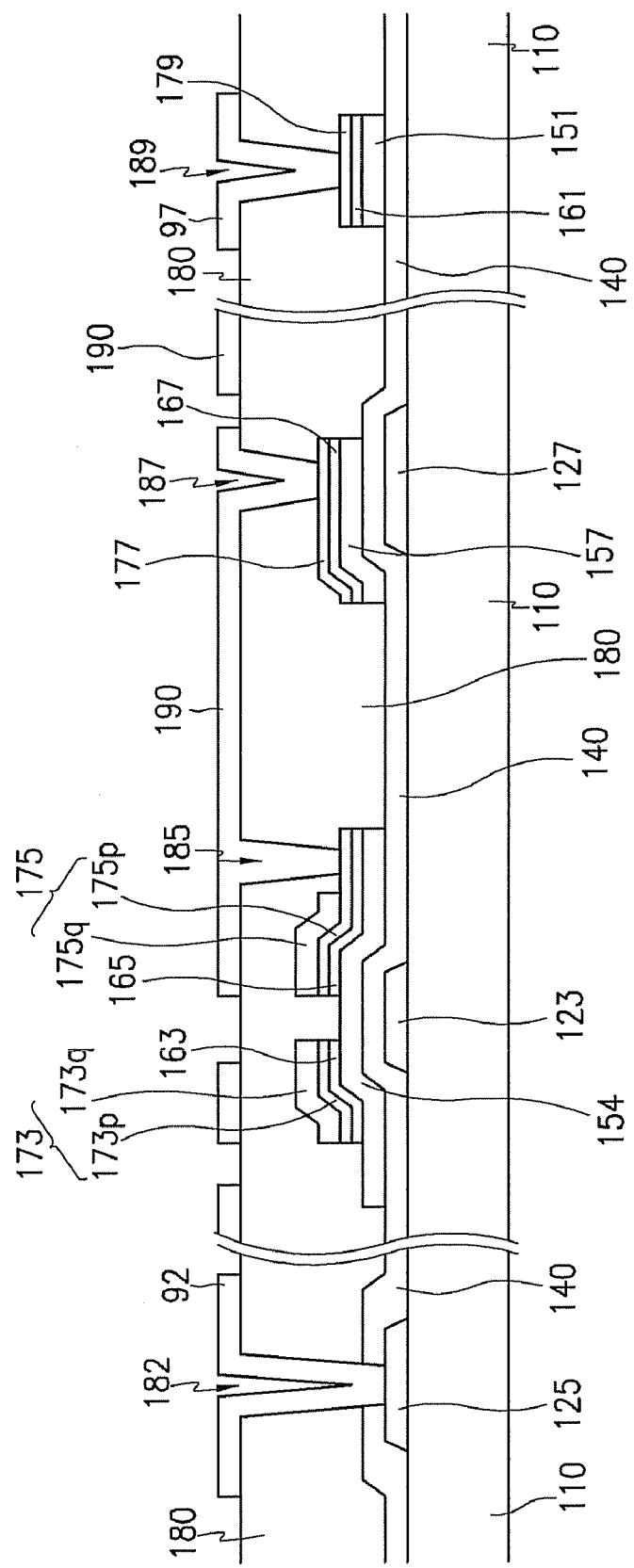
FIG. 9 is a sectional view of the TFT array panel shown in FIG. 8 taken along the line IX-IX'.

FIG. 8 is a layout view of an exemplary TFT array panel for an LCD according to another embodiment of the present invention, and FIG. 9 is a sectional view of the TFT array panel shown in FIG. 8 taken along the line IX-IX'.

As shown in FIGS. 8 and 9, a layered structure of a TFT array panel of an LCD according to this embodiment is almost the same as that shown in FIGS. 1 and 2. That is, a plurality of gate lines 121 including a plurality of gate electrodes 123 are formed on a substrate 110, and a gate insulating layer 140, a plurality of semiconductor stripes 151 including a plurality of extensions 154 and a plurality of semiconductor islands 157, and a plurality of ohmic contact stripes 161 including a plurality of extensions 163 and a plurality of ohmic contact islands 165 and 167 are sequentially formed thereon. A plurality of data lines 171 including a plurality of source electrodes 173, a plurality of drain electrodes 175, and a plurality of storage capacitor conductors 177 are formed on the ohmic contacts 161, 165 and 167, and a passivation layer 180 is formed thereon. A plurality of contact holes 182, 185, 187 and 189 are provided at the passivation layer 180 and/or the gate insulating layer 140, and a plurality of pixel electrodes 190 and a plurality of contact assistants 92 and 97 are formed on the passivation layer 180.

Different from the TFT array panel shown in FIGS. 1 and 2, the TFT array panel according to this embodiment provides a plurality of expansions 127 at each gate line 121 and overlaps the expansions 127 of the gate lines 121 with the storage capacitor conductors 177 to form storage capacitors without storage electrode lines.

The width of the semiconductor stripes 151 is larger than that of the data lines 171, while the semiconductor stripes 151 shown in FIGS. 1 and 2 has substantially the same width as the data lines 171. In addition, almost all portions of the data lines 171 except for contact portions 179 have a double-layered structure including a lower film 171p and an upper film 171q, while the data lines 171 shown in FIGS. 1 and 2 include several single-layered portions. In particular, the lower film 171p and the upper film 171q of the data lines 171 shown in FIGS. 8 and 9 have substantially the same width, while the upper film 171q of each data line 171 shown in FIGS. 1 and 2 has a width smaller than that of the lower film 171p.

An edge of each pixel electrode 190 overlaps a semiconductor stripe 151 adjacent thereto, while it does not overlap a data line 171 adjacent thereto. The overlapping of the pixel electrodes 190 and the semiconductor stripes 151 is minimally preferred for high aperture ratio when the width of the semiconductor stripes 151 is larger than that of the data lines 171.

Now, a method of manufacturing the TFT array panel shown in FIGS. 8 and 9 according to an embodiment of the present invention will be described in detail with reference to FIGS. 10A-14B as well as FIGS. 8 and 9.

FIGS. 10A, 11A, 12A and 14A are layout views of the TFT array panel shown in FIGS. 8 and 9 in intermediate steps of a manufacturing method thereof according to an embodiment of the present invention; FIG. 10B is a sectional view of the TFT array panel shown in FIG. 10A taken along the lines XB-XB'; FIG. 11B is a sectional view of the TFT array panel shown in FIG. 11A taken along the lines XIB-XIB', which illustrates the step following the step shown in FIG. 10B; FIG. 12B is a sectional view of the TFT array panel shown in FIG. 12A taken along the lines XIIB-XIIB', which illustrates the step following the step shown in FIG. 11B; FIG. 13 is a sectional view of the TFT array panel shown in FIG. 12A taken along the lines XIIB-XIIB', which illustrates the step following the step shown in FIG. 12B; and FIG. 14B is a sectional view of the TFT array panel shown in FIG. 14A taken along the lines XIVB-XIVB', which illustrates the step following the step shown in FIG. 13.

Figure 10A:
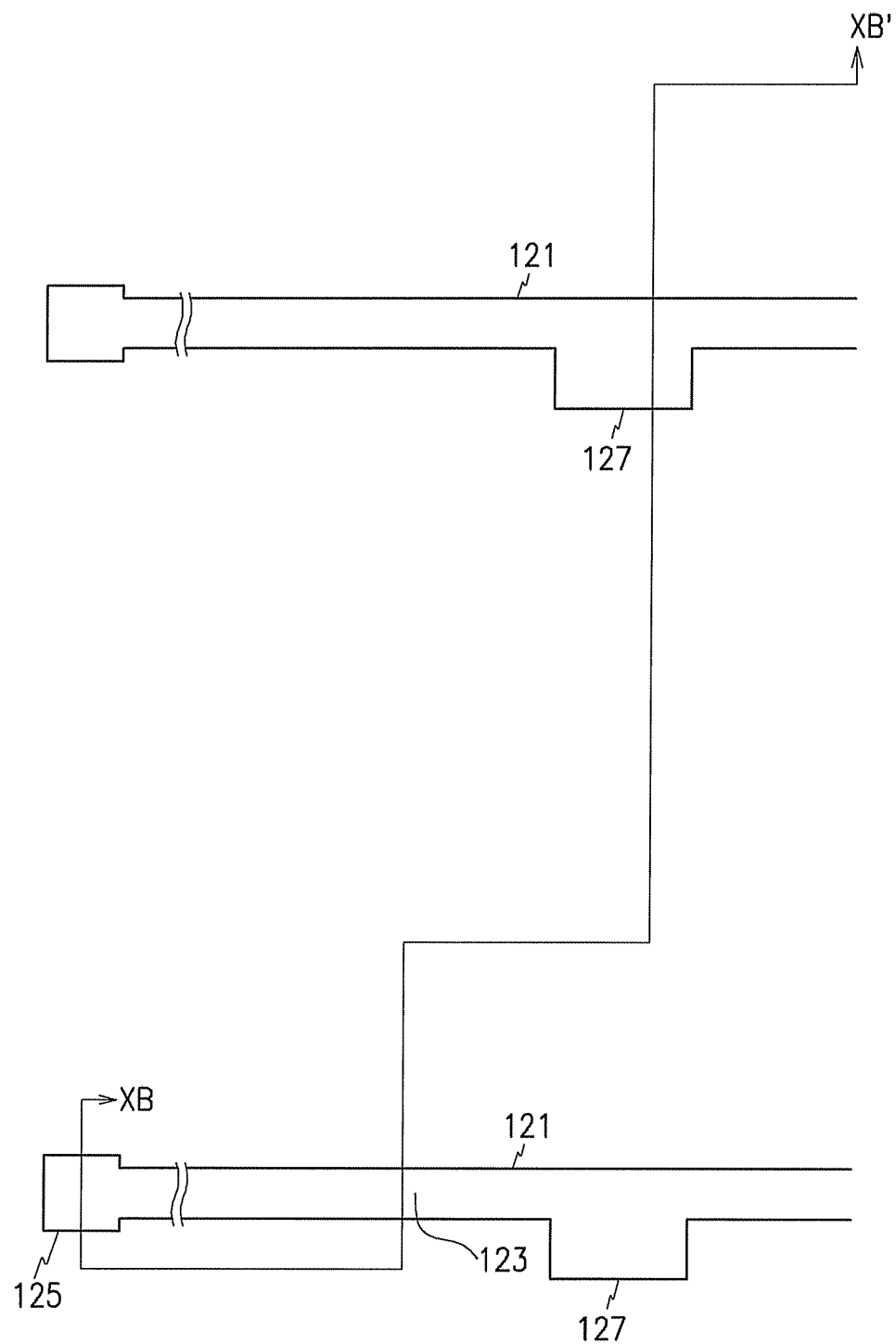
FIGS. 10A, 11A, 12A and 14A are layout views of the TFT array panel shown in FIGS. 8 and 9 in intermediate steps of a manufacturing method thereof according to an embodiment of the present invention.
Figure 10B:
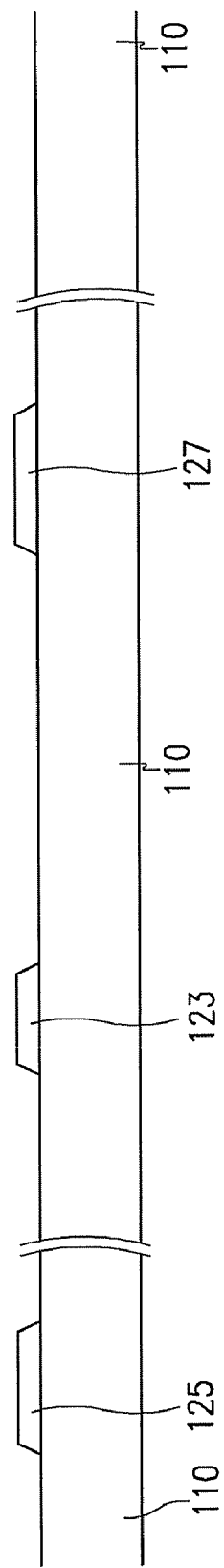
FIG. 10B is a sectional view of the TFT array panel shown in FIG. 10A taken along the lines XB-XB'.

Referring to FIGS. 10A and 10B, a plurality of gate lines 121 including a plurality of gate electrodes 123 and a plurality of expansions 127 are formed by photo etching on an insulating substrate 110 such as transparent glass.

After depositing a gate insulating layer 140, an intrinsic a-Si layer 150, and an extrinsic a-Si layer 160 in sequence, a lower conductive film and an upper conductive film are sequentially sputtered thereon. The lower conductive film is preferably made of Mo, Mo alloy or Cr having a good contact characteristic with IZO and ITO, and preferably has a thickness of about 500 Å. It is preferable that the upper conductive film has a thickness of about 2,500 Å, the sputtering target for the upper conductive film includes pure Al or Al—Nd containing 2 atomic % Nd, and the sputtering temperature is about 150° C.

Figure 11A:
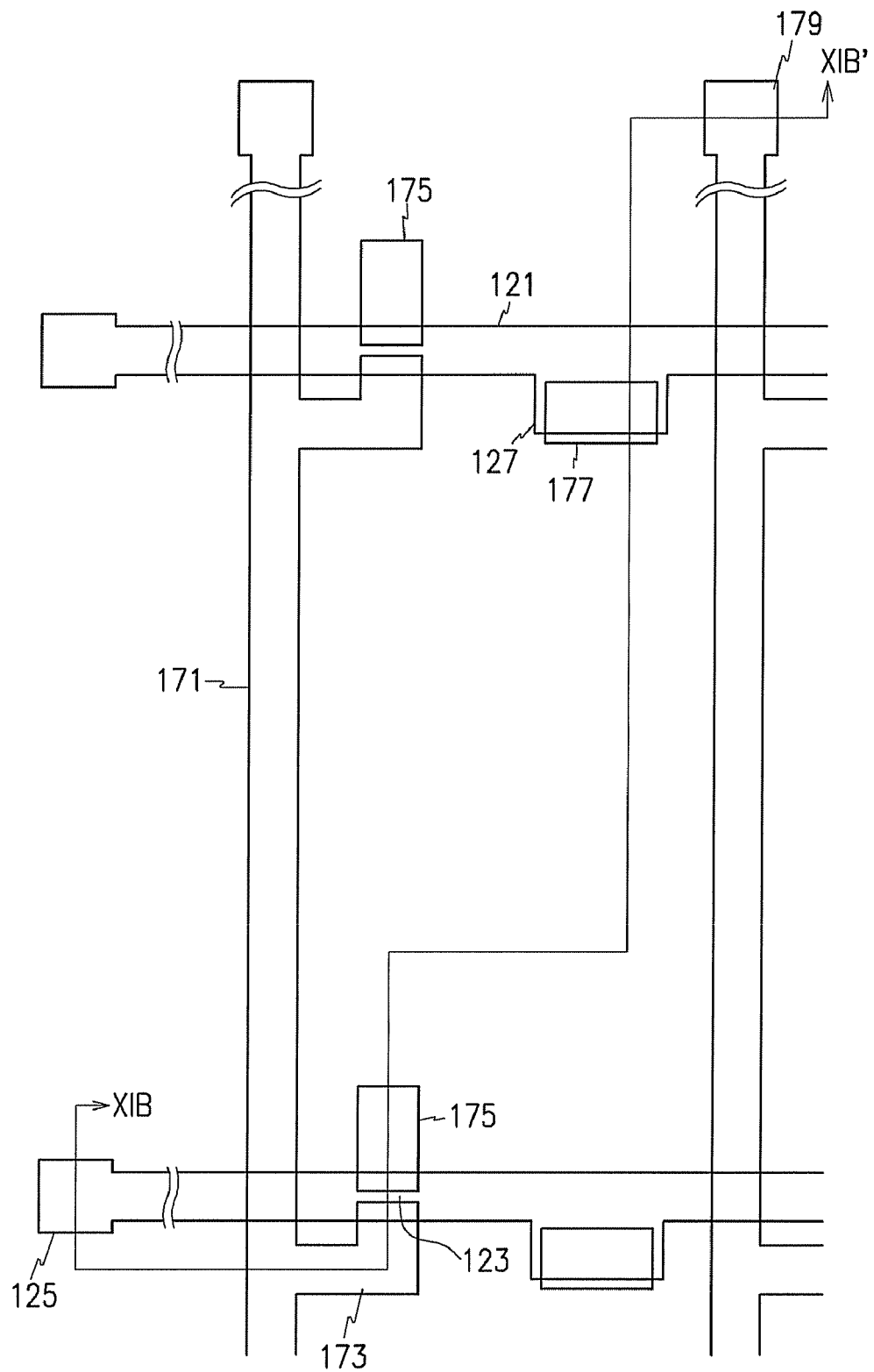
Figure 11B:
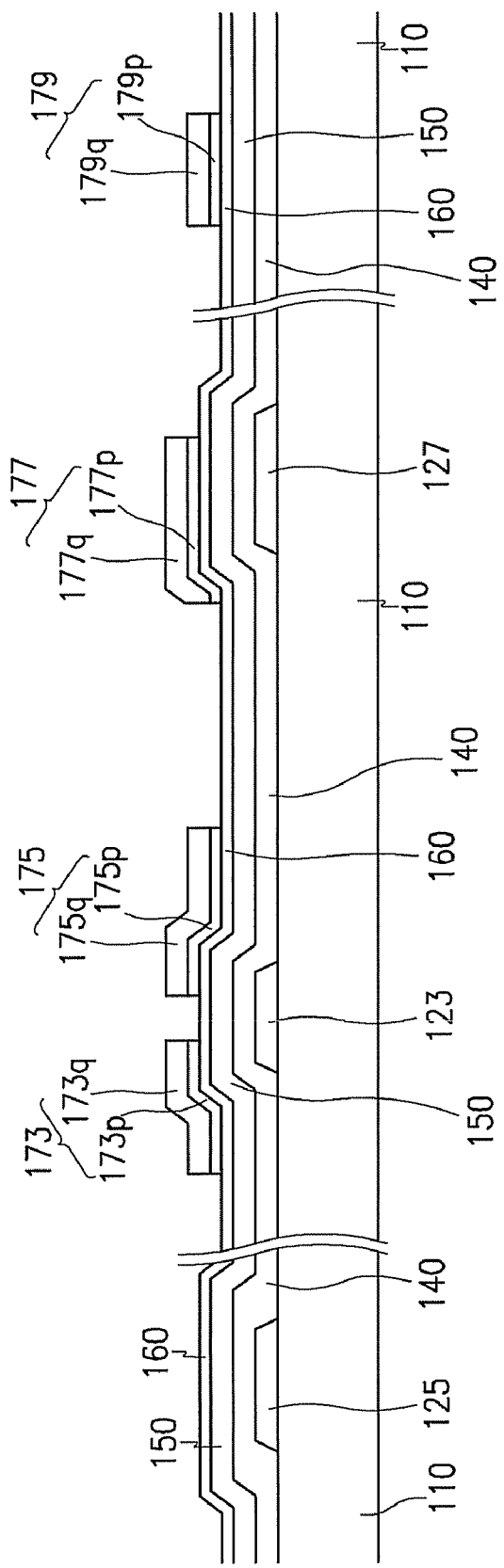
FIG. 11B is a sectional view of the TFT array panel shown in FIG. 11A taken along the lines XIB-XIB', which illustrates the step following the step shown in FIG. 10B.

Referring to FIGS. 11A and 11B, the upper film and the lower film are photo-etched to form a plurality of data lines 171 including a plurality of source electrodes 173, a plurality of drain electrodes 175, and a plurality of storage capacitor conductors 177, which have double-layered structures including a lower film 171p, 175p and 177p and an upper film 171q, 175q and 177q.

Figure 12A:
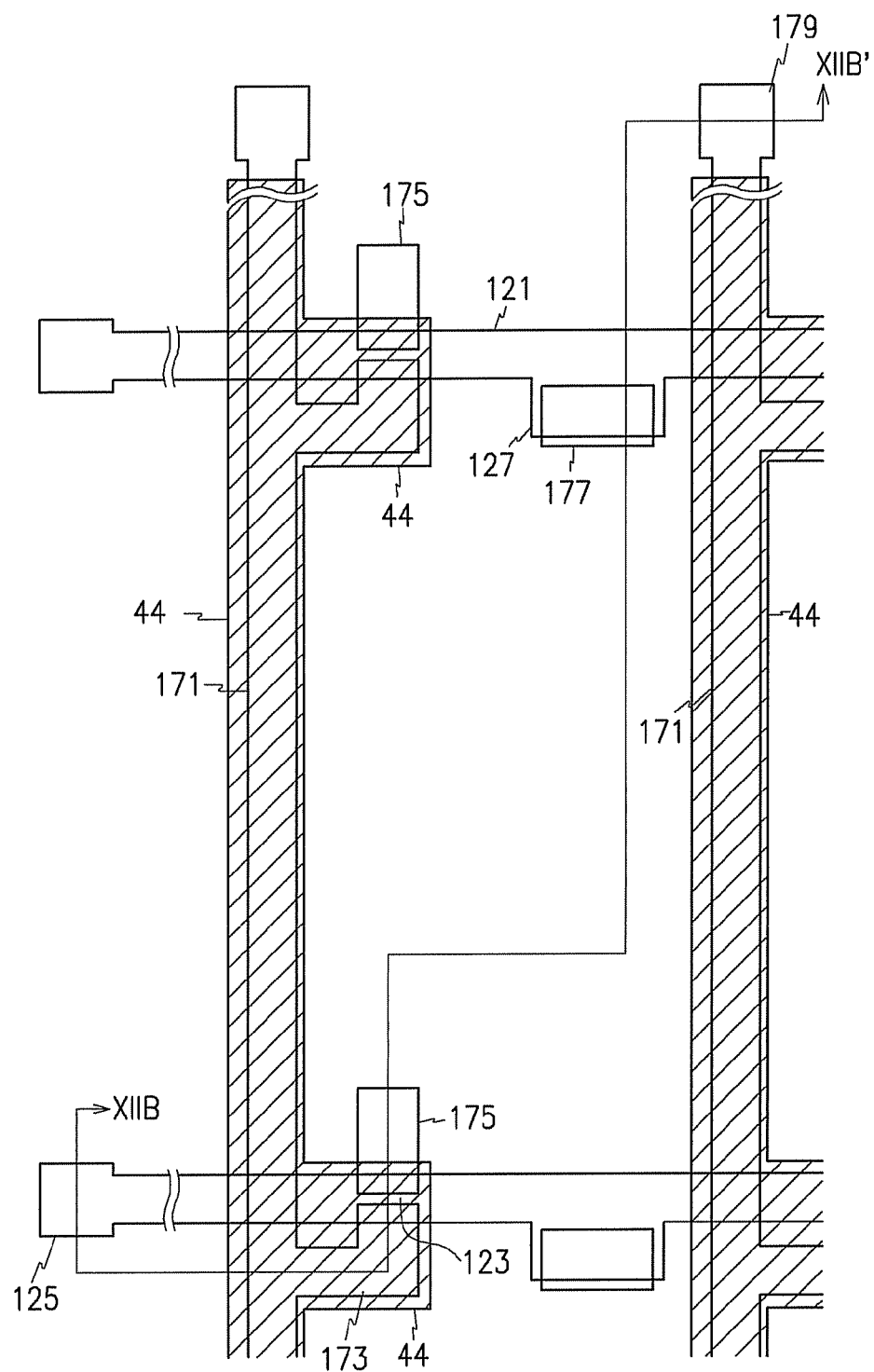
Figure 13:
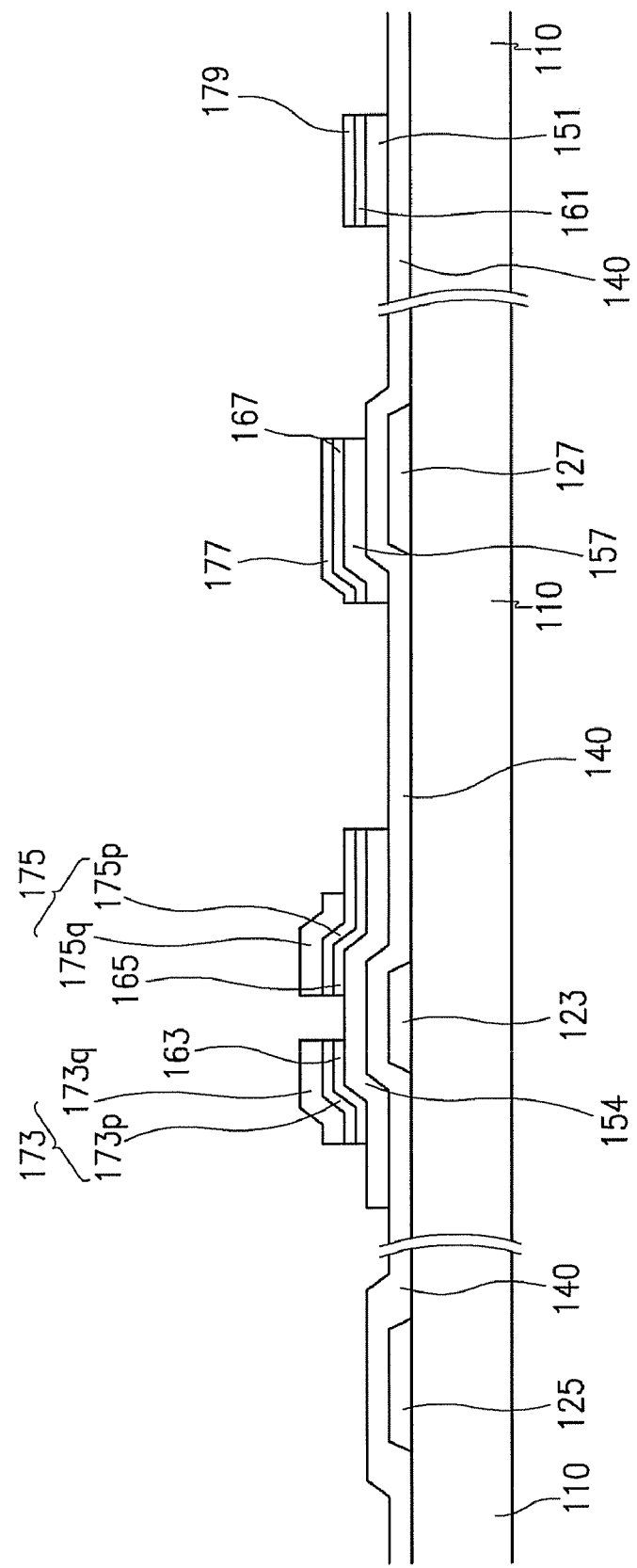
FIG. 13 is a sectional view of the TFT array panel shown in FIG. 12A taken along the lines XIIB-XIIB', which illustrates the step following the step shown in FIG. 12B.

A photoresist 44 is formed as shown in FIGS. 12A and 12B. The photoresist 44 does not cover contact portions of the data lines 171, the drain electrodes 175, and the storage capacitor electrodes 177, while it covers portions of the extrinsic a-Si layer 160 located between the source electrodes 173 and the drain electrodes 175. The exposed portions of the upper film 171q, 175q and 177q are etched out using the photoresist 44 as an etch mask.

The extrinsic a-Si layer 160 and the intrinsic a-Si layer 150 are etched using the photoresist 44 as well as the data lines 171, the drain electrodes 175, and the storage capacitor conductors 177 as an etch mask to form a plurality of extrinsic semiconductor stripes and islands 164 and 167 and a plurality of intrinsic semiconductor stripes and islands 151 and 157. After removing the photoresist 44, exposed portions of the extrinsic semiconductor stripes 164 are removed to complete a plurality of ohmic contact stripes and islands 161, 165 and 167 and to expose underlying portions of the intrinsic semiconductor stripes 151 as shown in FIG. 13.

Figure 14A:
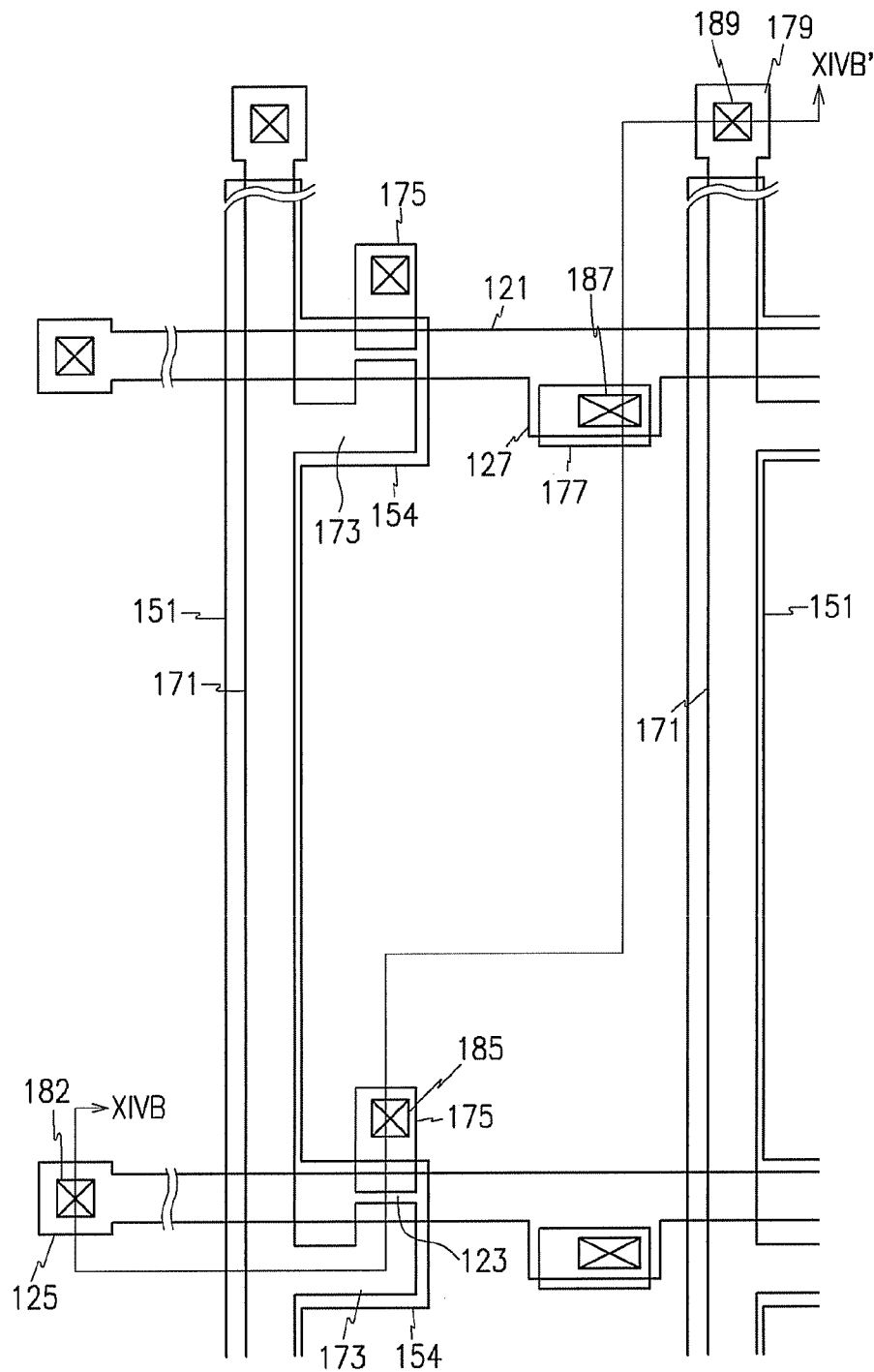
Figure 14B:
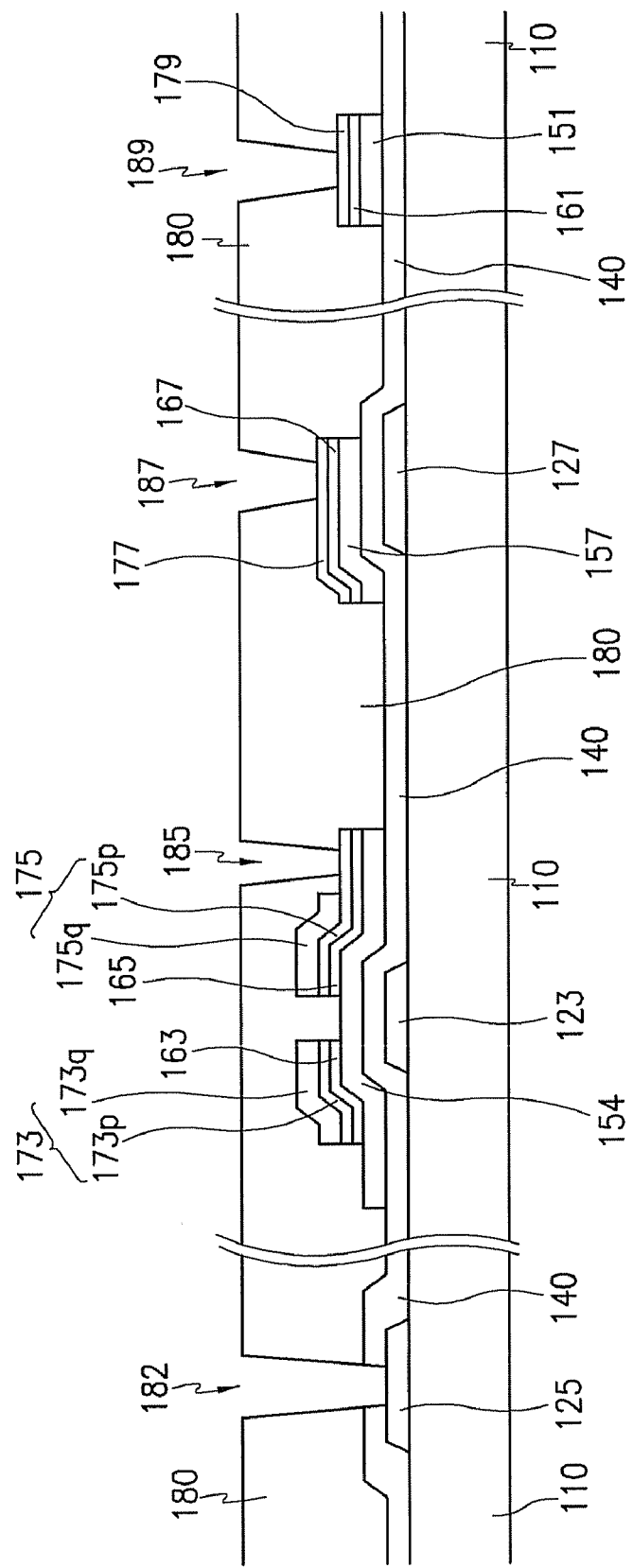
FIG. 14B is a sectional view of the TFT array panel shown in FIG. 14A taken along the lines XIVB-XIVB', which illustrates the step following the step shown in FIG. 13.

As shown in FIGS. 14A and 14B, after depositing a passivation layer 180, the passivation layer 180 and the gate insulating layer 140 are dry-etched using photolithography to form a plurality of contact holes 182, 185, 187 and 189 exposing end portions 125 of the gate lines 121, the drain electrodes 175, the storage capacitor conductors 177, and end portions 179 of the data lines 171, respectively.

Finally, as shown in FIGS. 8 and 9, a plurality of pixel electrodes 190 and a plurality of contact assistants 92 and 97 are formed on the passivation layer 180.

In the TFT array panel according to an embodiment of the present invention, the gate lines 121 and the data lines 171 include Al or Al alloy with low resistivity while they have reduced contact resistance between the IZO or ITO pixel electrodes 190. Moreover, the Al containing metal layer is removed at the contact portions during the formation of the semiconductor stripes and islands 151 and 157 without an additional photo etching step, thereby simplifying the manufacturing process.

A TFT array panel for an LCD according to another embodiment of the present invention will be described in detail with reference to FIGS. 15 and 16.

Figure 15:
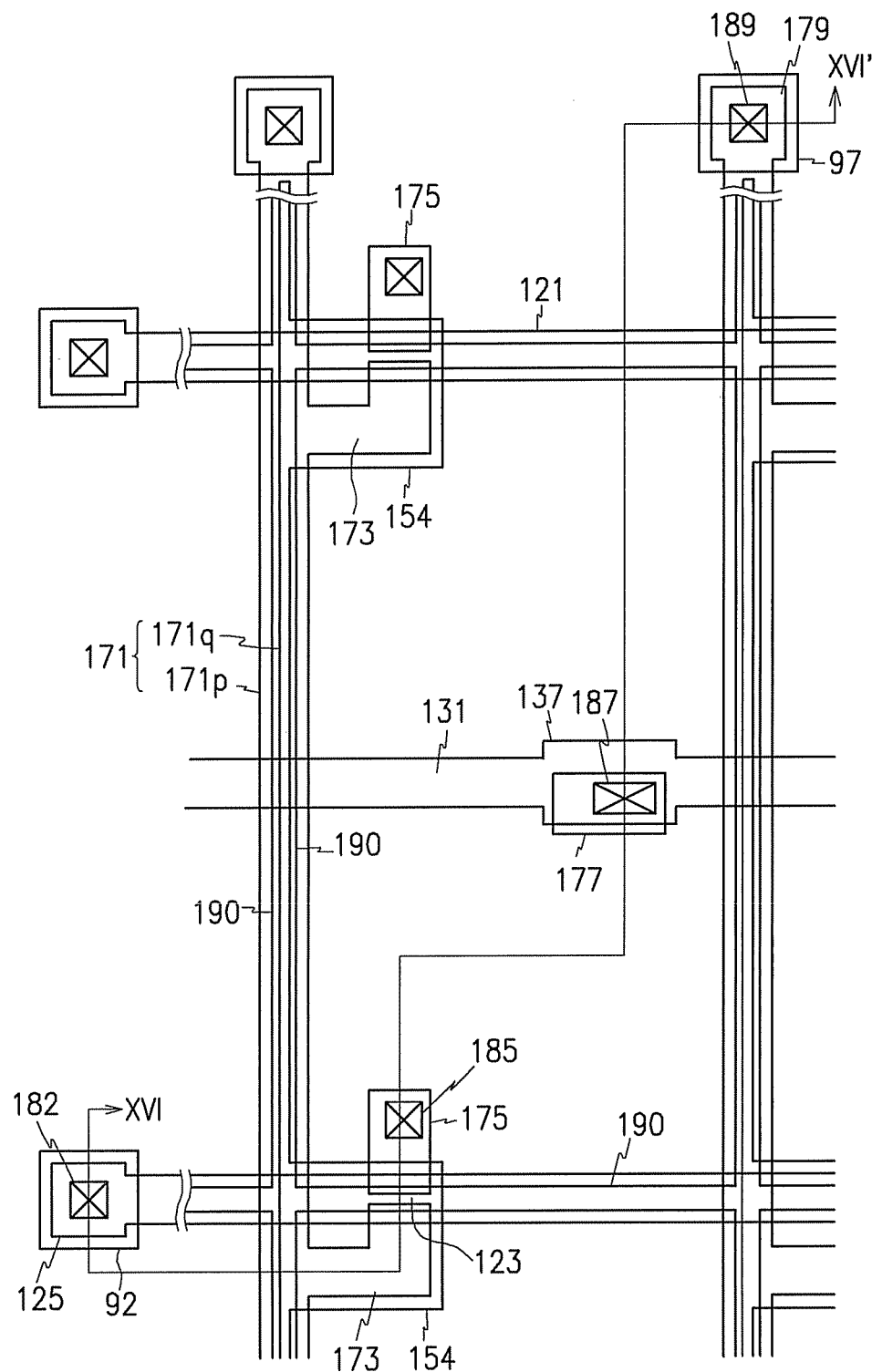
FIG. 15 is a layout view of an exemplary TFT array panel for an LCD according to another embodiment of the present invention.
Figure 16:
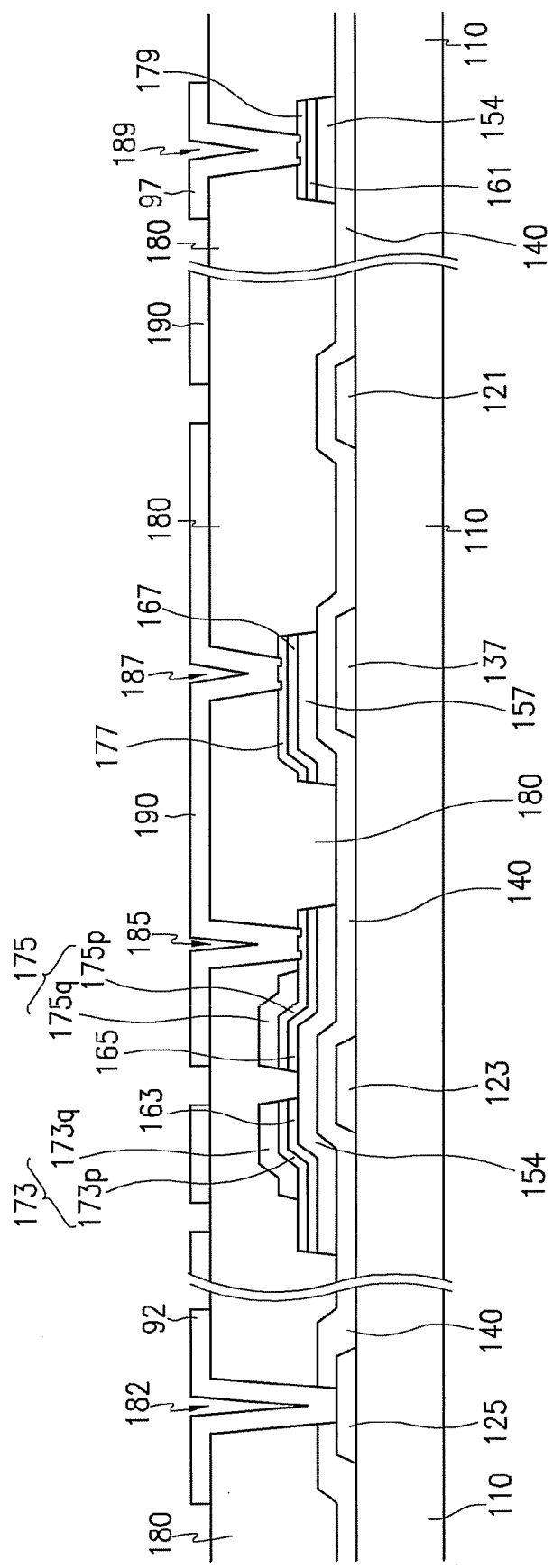
FIG. 16 is a sectional view of the TFT array panel shown in FIG. 15 taken along the line XVI-XVI'.

FIG. 15 is a layout view of an exemplary TFT array panel for an LCD according to another embodiment of the present invention, and FIG. 16 is a sectional view of the TFT array panel shown in FIG. 15 taken along the line XVI-XVI'.

As shown in FIGS. 15 and 16, a structure of a TFT array panel of an LCD according to this embodiment is almost the same as that shown in FIGS. 1 and 2. That is, a plurality of gate lines 121 including a plurality of gate electrodes 123 and a plurality of storage electrode lines 131 including a plurality of expansions are formed on a substrate 110, and a gate insulating layer 140, a plurality of semiconductor stripes 151 including a plurality of extensions 154 and a plurality of semiconductor islands 157, and a plurality of ohmic contact stripes 161 including a plurality of extensions 163 and a plurality of ohmic contact islands 165 and 167 are sequentially formed thereon. A plurality of data lines 171 including a plurality of source electrodes 173, a plurality of drain electrodes 175, and a plurality of storage capacitor conductors 177 are formed on the ohmic contacts 161, 165 and 167, and a passivation layer 180 is formed thereon. A plurality of contact holes 182, 185, 187 and 189 are provided at the passivation layer 180 and/or the gate insulating layer 140, and a plurality of pixel electrodes 190 and a plurality of contact assistants 92 and 97 are formed on the passivation layer 180.

Different from the TFT array panel shown in FIGS. 1 and 2, the TFT array panel according to this embodiment provides unevenness on surfaces of contact portions of the data lines 171, the drain electrodes 175, and the storage capacitor conductors 177, which are exposed through the contact holes 189, 185 and 187.

Now, a method of manufacturing the TFT array panel shown in FIGS. 15 and 16 according to an embodiment of the present invention will be described in detail with reference to FIGS. 17A-21B as well as FIGS. 15 and 16.

FIGS. 17A, 18A, 19A and 21A are layout views of the TFT array panel shown in FIGS. 15 and 16 in intermediate steps of a manufacturing method thereof according to an embodiment of the present invention; FIG. 17B is a sectional view of the TFT array panel shown in FIG. 17A taken along the lines XVIIB-XVIIB'; FIG. 18B is a sectional view of the TFT array panel shown in FIG. 18A taken along the lines XVIIIB-XVIIIB', which illustrates the step following the step shown in FIG. 17B; FIG. 19B is a sectional view of the TFT array panel shown in FIG. 19A taken along the lines XIXB-XIXB', which illustrates the step following the step shown in FIG. 18B; FIG. 20 is a sectional view of the TFT array panel shown in FIG. 19A taken along the lines XIXB-XIXB', which illustrates the step following the step shown in FIG. 19B; and FIG. 21B is a sectional view of the TFT array panel shown in FIG. 21A taken along the lines XXIB-XXIB', which illustrates the step following the step shown in FIG. 20.

Figure 17A:
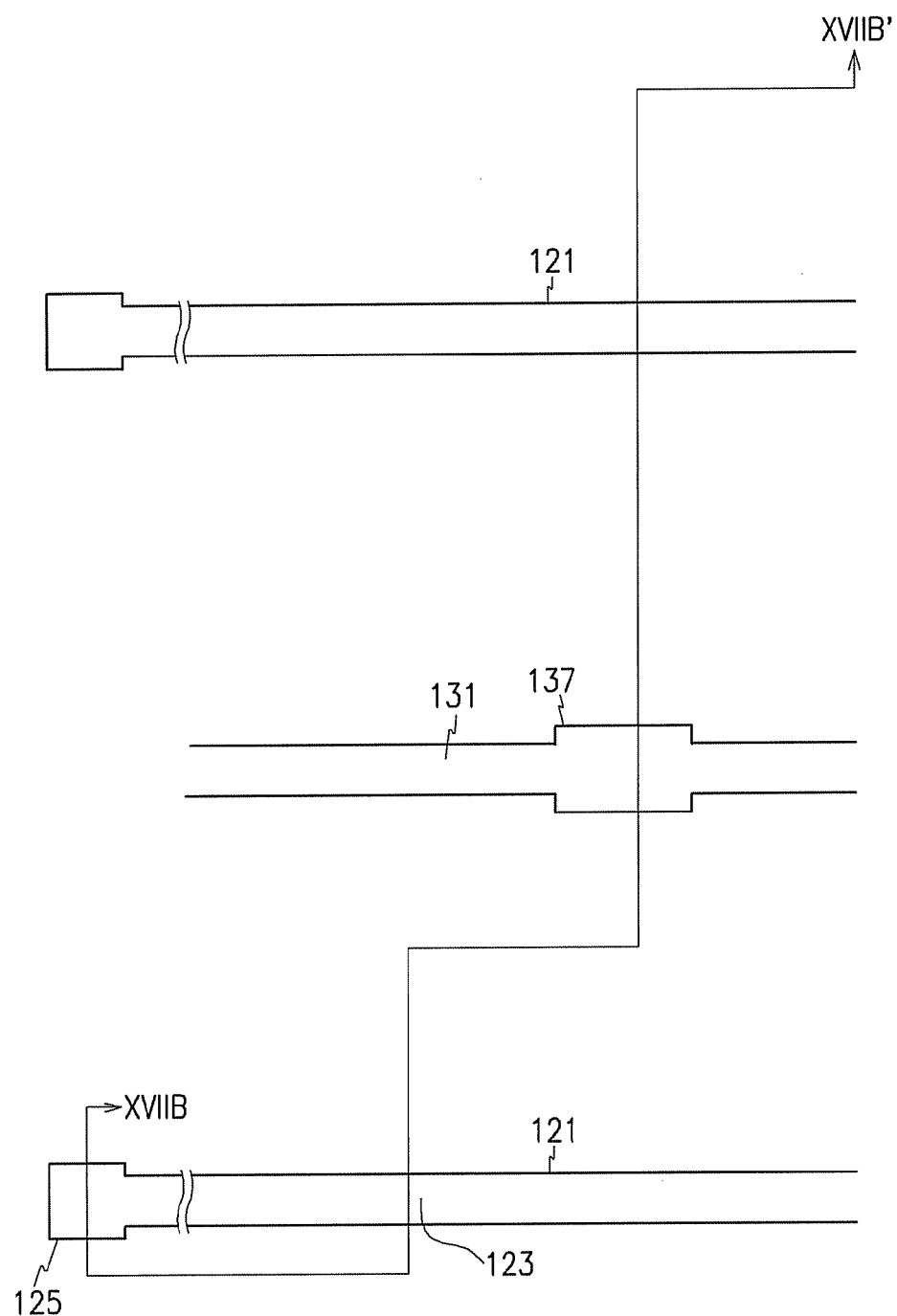
FIGS. 17A, 18A, 19A and 21A are layout views of the TFT array panel shown in FIGS. 15 and 16 in intermediate steps of a manufacturing method thereof according to an embodiment of the present invention.
Figure 17B:
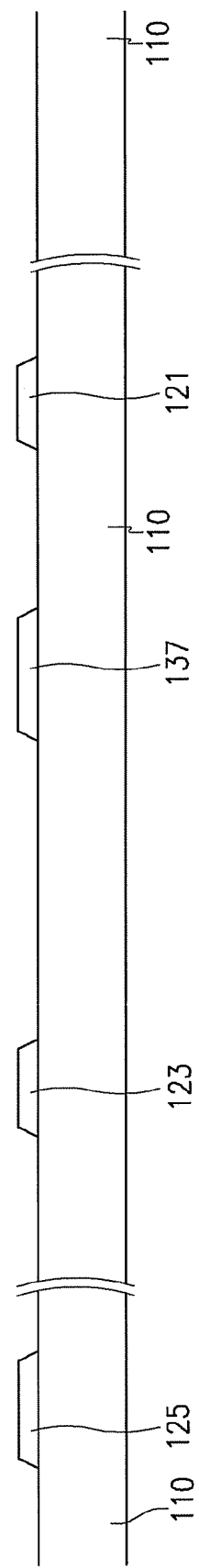
FIG. 17B is a sectional view of the TFT array panel shown in FIG. 17A taken along the lines XVIIB-XVIIB'.

Referring to FIGS. 17A and 17B, a plurality of gate lines 121 including a plurality of gate electrodes 123 and a plurality of storage electrode lines 131 including a plurality of expansions 137 are formed by photo etching on an insulating substrate 110 such as transparent glass.

After depositing a gate insulating layer 140, an intrinsic a-Si layer 150, and an extrinsic a-Si layer 160 in sequence, a lower conductive film and an upper conductive film are sequentially sputtered thereon. The lower conductive film is preferably made of Mo, Mo alloy or Cr having a good contact characteristic with IZO and ITO, and preferably has a thickness of about 500 Å. It is preferable that the upper conductive film has a thickness of about 2,500 Å, the sputtering target for the upper conductive film includes pure Al or Al—Nd containing 2 atomic % Nd, and the sputtering temperature is about 150° C.

Figure 18A:
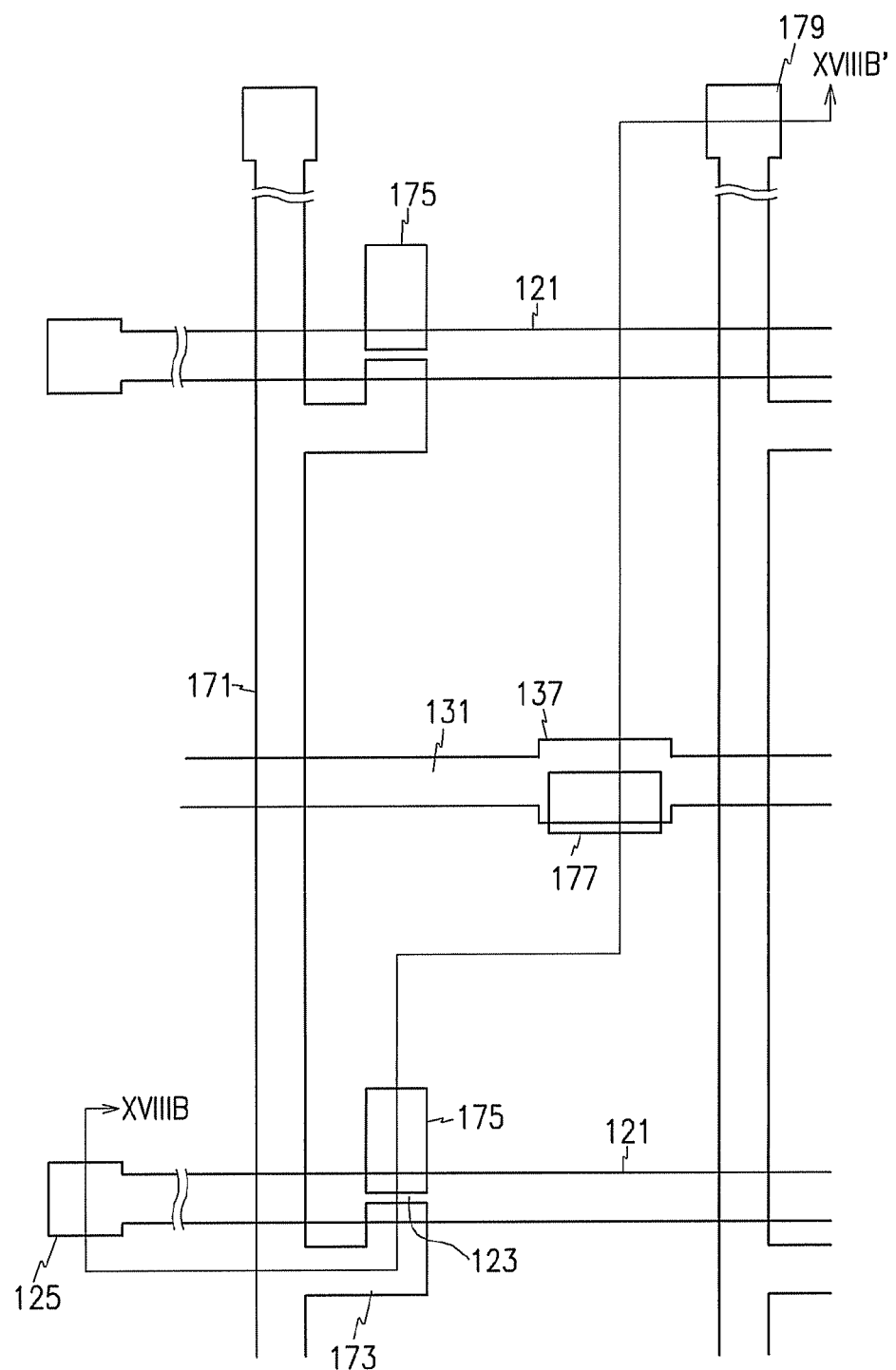
Figure 18B:
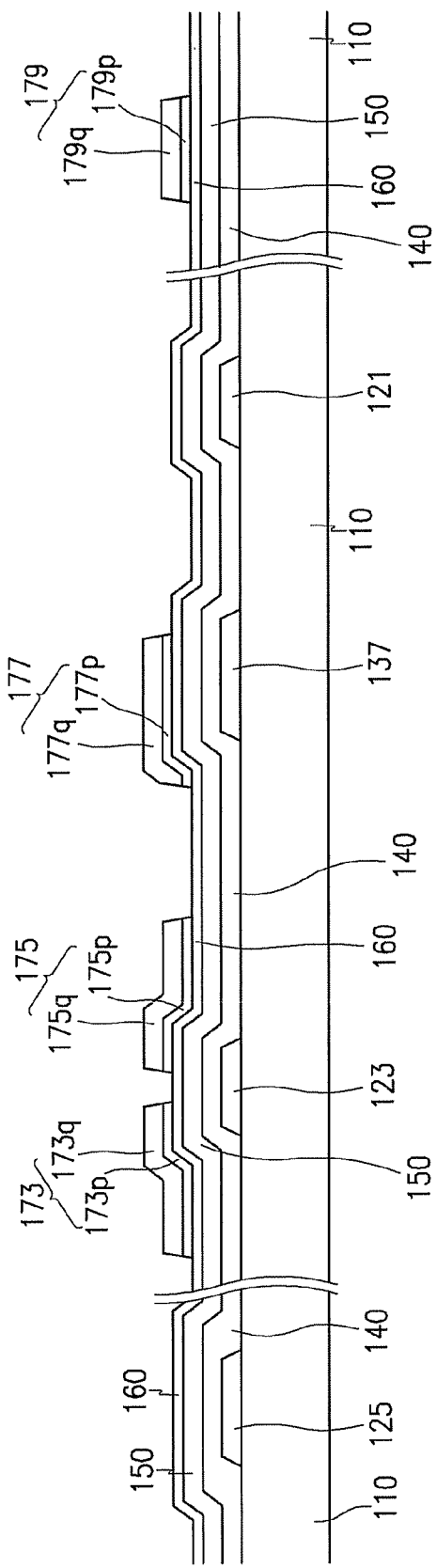
FIG. 18B is a sectional view of the TFT array panel shown in FIG. 18A taken along the lines XVIIIB-XVIIIB', which illustrates the step following the step shown in FIG. 17B.

Referring to FIGS. 18A and 18B, the upper film and the lower film are photo-etched to form a plurality of data lines 171 including a plurality of source electrodes 173, a plurality of drain electrodes 175, and a plurality of storage capacitor conductors 177, which have double-layered structures including a lower film 171p, 175p and 177p and an upper film 171q, 175q and 177q.

Figure 19A:
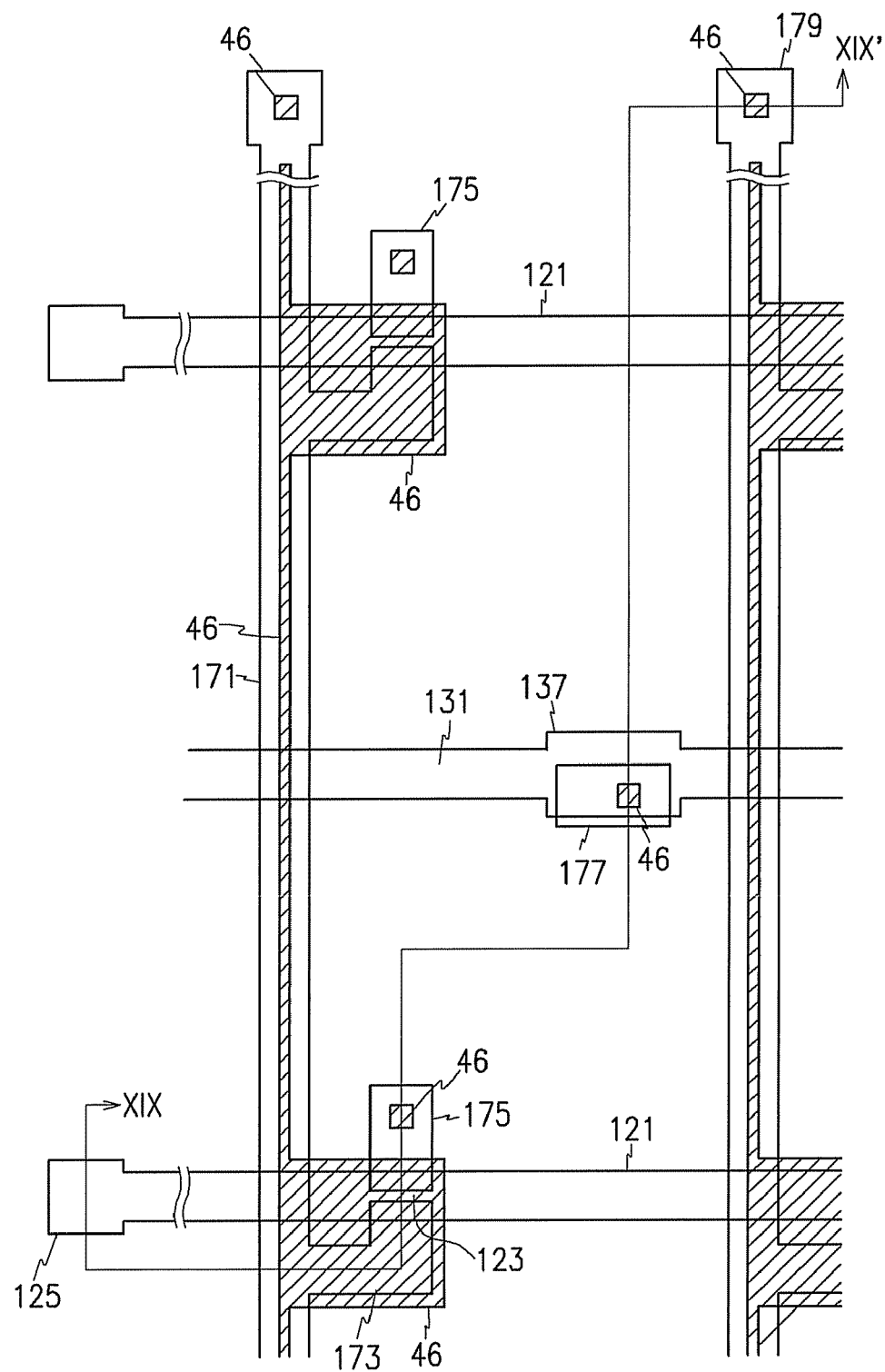
Figure 19B:
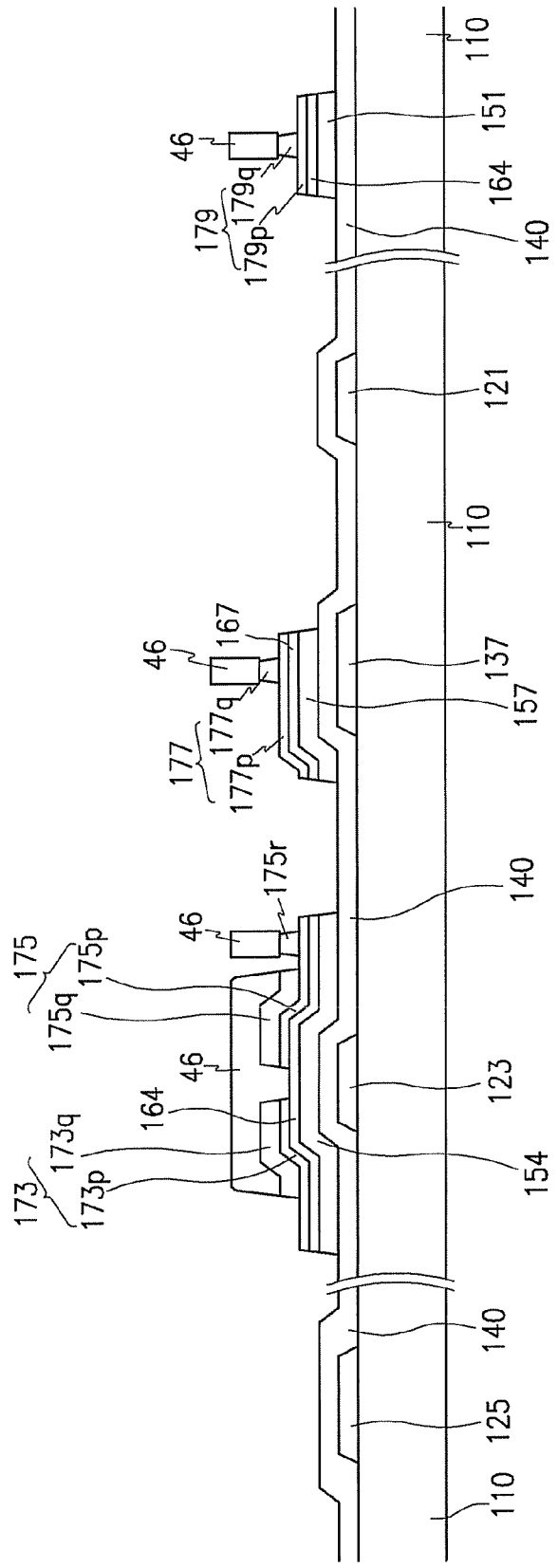
FIG. 19B is a sectional view of the TFT array panel shown in FIG. 19A taken along the lines XIXB-XIXB', which illustrates the step following the step shown in FIG. 18B.
Figure 20:
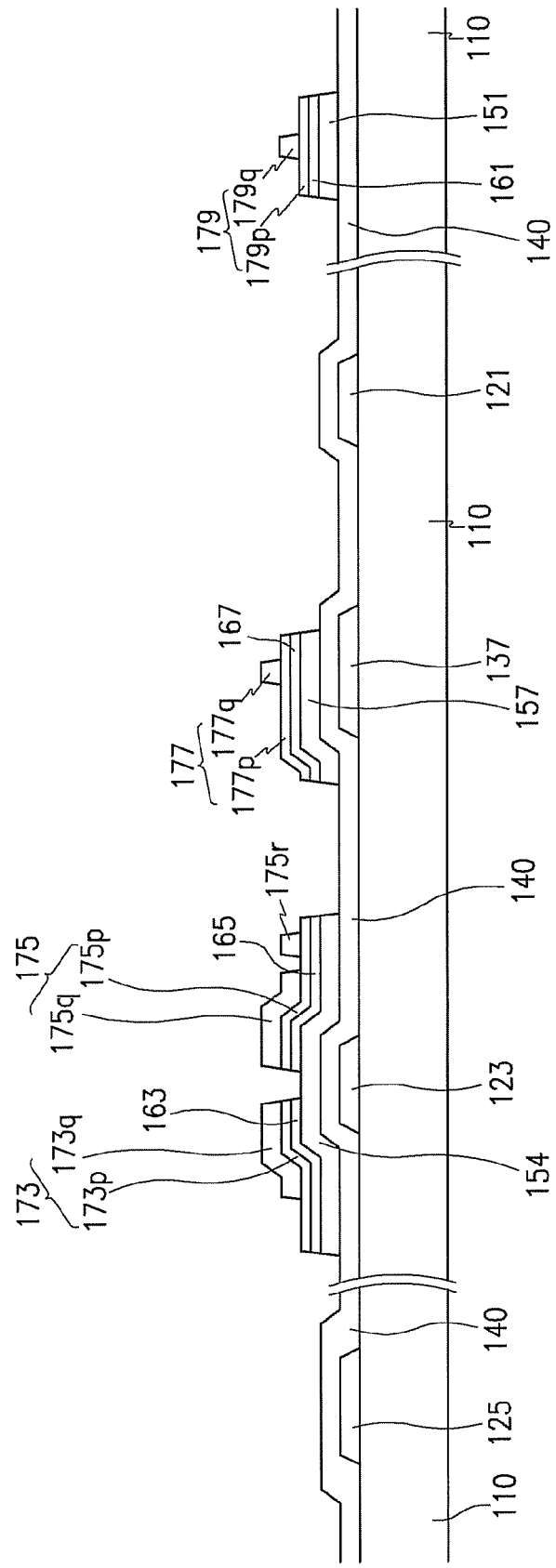
FIG. 20 is a sectional view of the TFT array panel shown in FIG. 19A taken along the lines XIXB-XIXB', which illustrates the step following the step shown in FIG. 19B.

A photoresist 46 is formed as shown in FIGS. 19A and 19B. The photoresist 46 cover a part of and does not cover remaining part of contact portions of the data lines 171, the drain electrodes 175, and the storage capacitor electrodes 177, while it covers portions of the extrinsic a-Si layer 160 located between the source electrodes 173 and the drain electrodes 175. Portions of the photoresist 46 on the contact portions are isolated from other portions and may have various shapes although FIG. 19A shows rectangular portions. The exposed portions of the upper film 171q, 175q and 177q are etched out using the photoresist 46 as an etch mask. Then, a plurality of conductive islands 175q, 177q and 179q are remained on the contact portions of the drain electrodes 175, the storage capacitor conductors 177, and the data lines 171.

The extrinsic a-Si layer 160 and the intrinsic a-Si layer 150 are dry-etched using the photoresist 46 as well as the data lines 171, the drain electrodes 175, and the storage capacitor conductors 177 as an etch mask to form a plurality of extrinsic semiconductor stripes and islands 164 and 167 and a plurality of intrinsic semiconductor stripes and islands 151 and 157. After removing the photoresist 46, exposed portions of the extrinsic semiconductor stripes 164 are exposed by dry-etching to complete a plurality of ohmic contact stripes and islands 161, 165 and 167 and to expose underlying portions of the intrinsic semiconductor stripes 151 as shown in FIG. 20.

As described above, several dry-etching steps are performed for patterning the extrinsic a-Si layer 160, the intrinsic a-Si layer 150, and the extrinsic semiconductor stripes 164. The photoresist islands 46 and the conductive islands 175q, 177q and 179q on the drain electrodes 175, the storage capacitor conductors 177, and the data lines 171 protect underlying portions of the lower film 175p, 177p and 179p from dry-etching. On the contrary, exposed portions of the lower film 175p, 177p and 179p may be etched to some degrees.

Figure 21A:
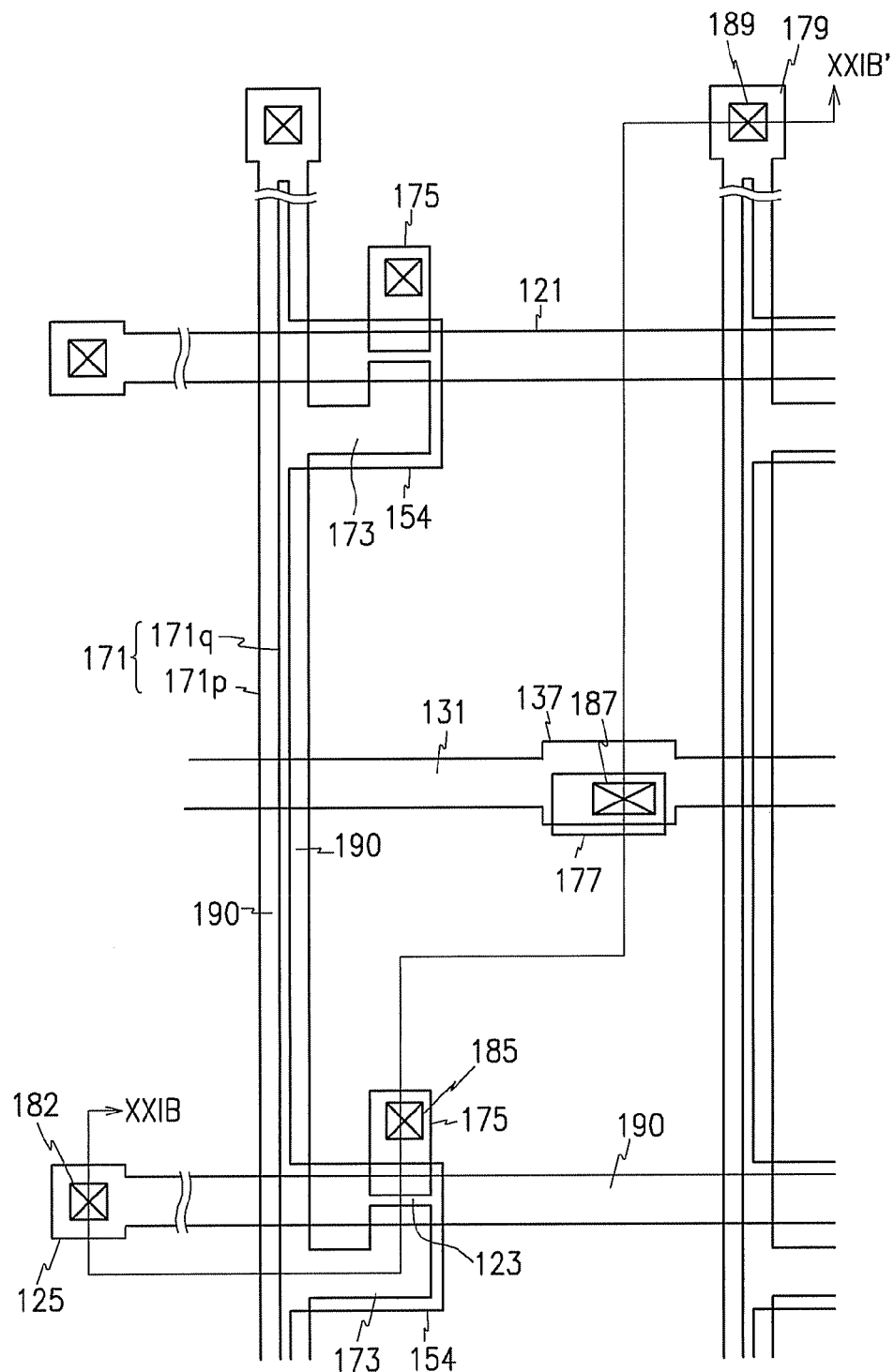
Figure 21B:
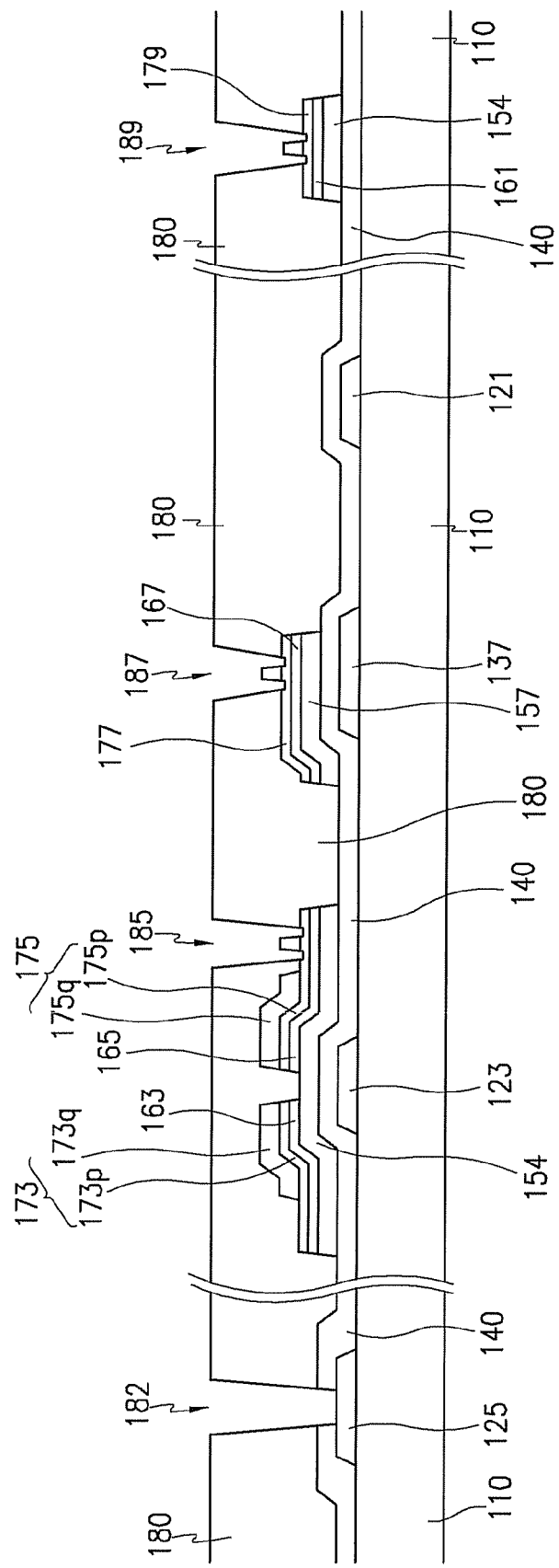
FIG. 21B is a sectional view of the TFT array panel shown in FIG. 21A taken along the lines XXIB-XXIB', which illustrates the step following the step shown in FIG. 20.

As shown in FIGS. 21A and 21B, after depositing a passivation layer 180, the passivation layer 180 and the gate insulating layer 140 are dry-etched using photolithography to form a plurality of contact holes 182, 185, 187 and 189 exposing end portions 125 of the gate lines 121, the drain electrodes 175, the storage capacitor conductors 177, and end portions 179 of the data lines 171, respectively. The dry-etching of the passivation layer 180 also carves out exposed portions of the lower film 175p, 177p and 179p at the contact holes 185, 187 and 189, while it cannot etch the protected portions of the lower film 175p, 177p and 179p covered with the conductive islands 175q, 177q and 179q. Accordingly, the surface of the lower film 175p, 177p and 179p has unevenness.

Subsequently, the conductive islands 175q, 177q and 179q are removed by blanket etch to expose underlying clean surface of the lower film 175p, 177p and 179p.

Finally, as shown in FIGS. 15 and 16, a plurality of pixel electrodes 190 and a plurality of contact assistants 92 and 97 are formed on the passivation layer 180.

Since the pixel electrodes 190 and the contact assistants 92 and 97 contacts the clean surface of the lower film 175p, 177p and 179p having unevenness, the contact resistance therebetween is reduced.

A TFT array panel for an LCD according to another embodiment of the present invention will be described in detail with reference to FIGS. 22 and 23.

Figure 22:
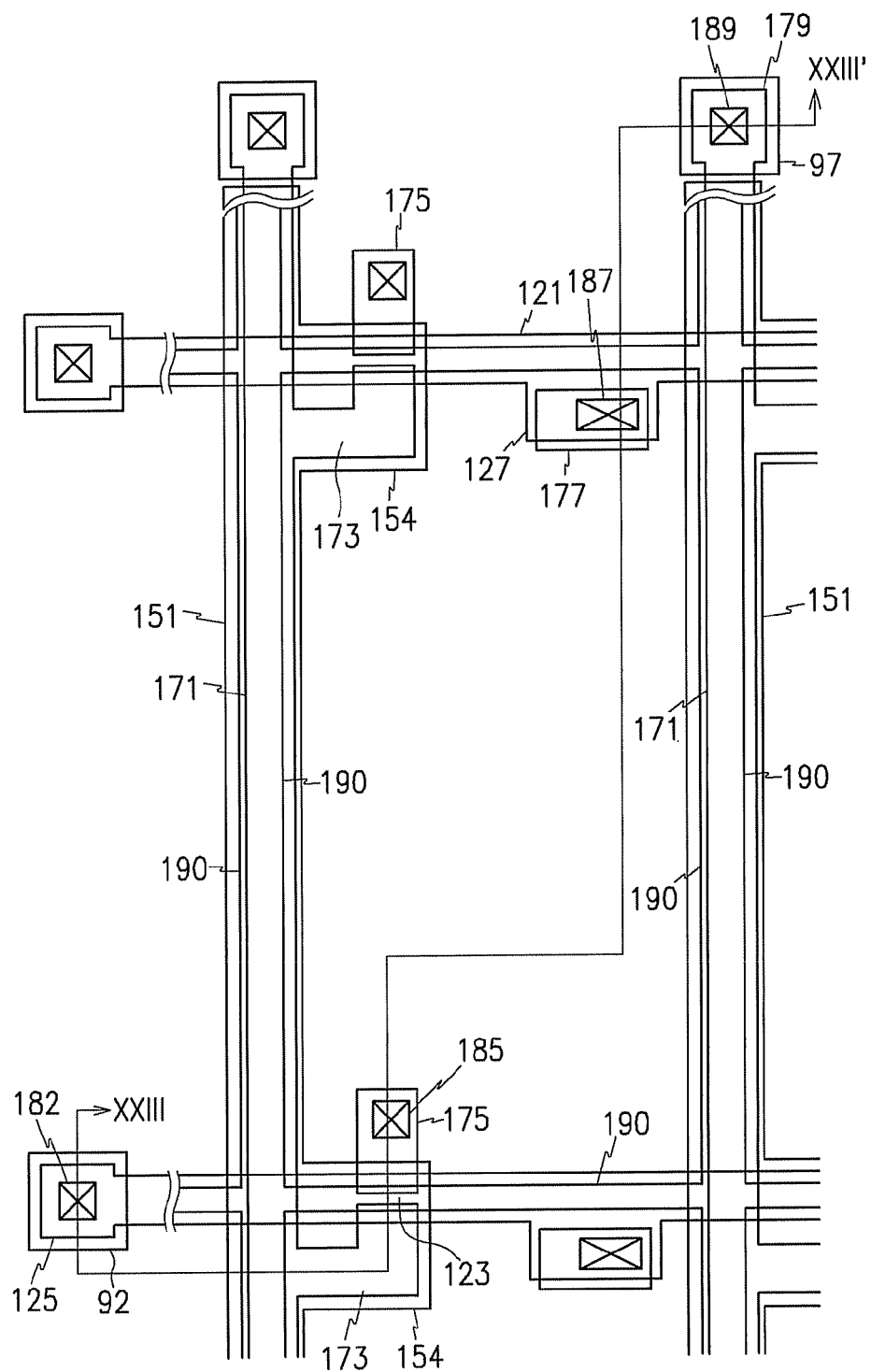
FIG. 22 is a layout view of an exemplary TFT array panel for an LCD according to another embodiment of the present invention.
Figure 23:
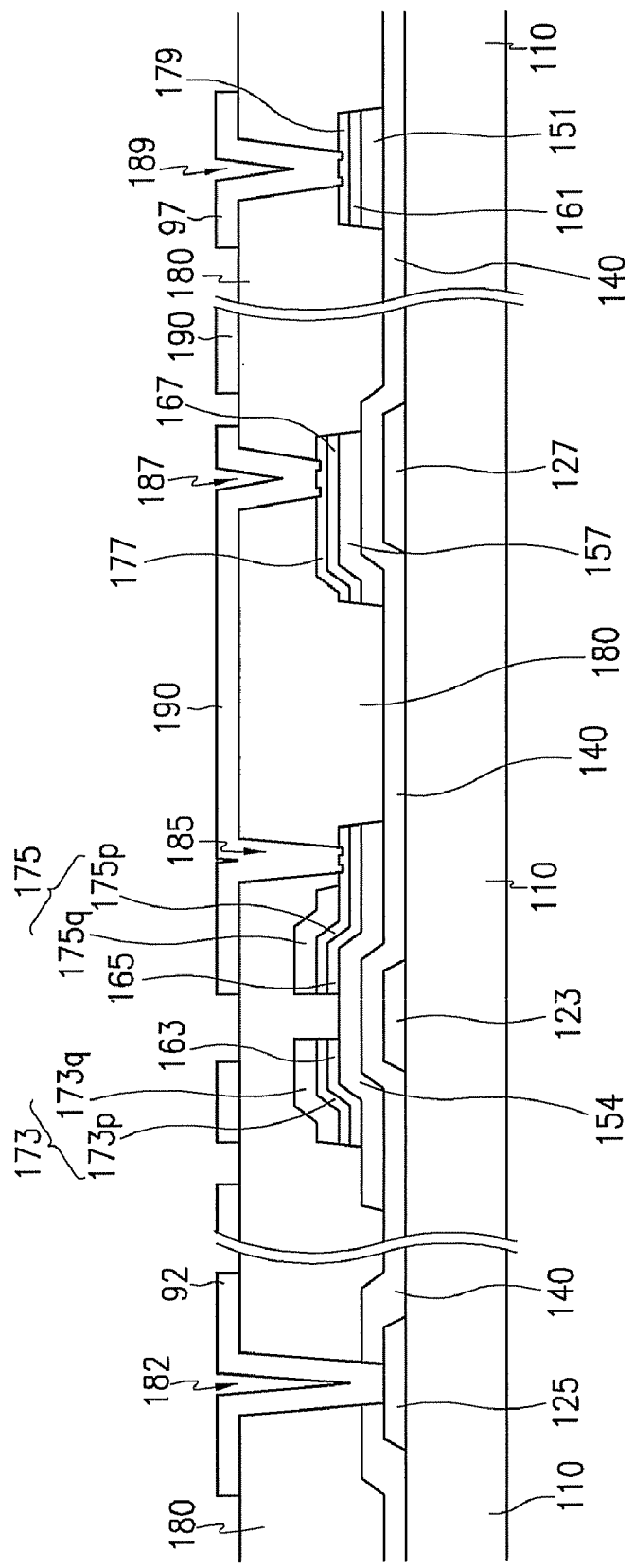
FIG. 23 is a sectional view of the TFT array panel shown in FIG. 22 taken along the line XXIII-XXIII'.

FIG. 22 is a layout view of an exemplary TFT array panel for an LCD according to another embodiment of the present invention, and FIG. 23 is a sectional view of the TFT array panel shown in FIG. 22 taken along the line XXIII-XXIII'.

As shown in FIGS. 22 and 23, a structure of a TFT array panel of an LCD according to this embodiment is almost the same as that shown in FIGS. 8 and 9. That is, a plurality of gate lines 121 including a plurality of gate electrodes 123 and a plurality of expansions 127 are formed on a substrate 110, and a gate insulating layer 140, a plurality of semiconductor stripes 151 including a plurality of extensions 154 and a plurality of semiconductor islands 157, and a plurality of ohmic contact stripes 161 including a plurality of extensions 163 and a plurality of ohmic contact islands 165 and 167 are sequentially formed thereon. A plurality of data lines 171 including a plurality of source electrodes 173, a plurality of drain electrodes 175, and a plurality of storage capacitor conductors 177 are formed on the ohmic contacts 161, 165 and 167, and a passivation layer 180 is formed thereon. A plurality of contact holes 182, 185, 187 and 189 are provided at the passivation layer 180 and/or the gate insulating layer 140, and a plurality of pixel electrodes 190 and a plurality of contact assistants 92 and 97 are formed on the passivation layer 180.

Different from the TFT array panel shown in FIGS. 8 and 9 and similar to that shown in FIGS. 15 and 16, the TFT array panel according to this embodiment provides unevenness on surfaces of contact portions of the data lines 171, the drain electrodes 175, and the storage capacitor conductors 177, which are exposed through the contact holes 189, 185 and 187.

Now, a method of manufacturing the TFT array panel shown in FIGS. 22 and 23 according to an embodiment of the present invention will be described in detail with reference to FIGS. 24A-28B as well as FIGS. 22 and 23.

FIG. 23 is a sectional view of the TFT array panel shown in FIG. 22 taken along the line XXIII-XXIII'; FIGS. 24A, 25A, 26A and 28A are layout views of the TFT array panel shown in FIGS. 22 and 23 in intermediate steps of a manufacturing method thereof according to an embodiment of the present invention; FIG. 24B is a sectional view of the TFT array panel shown in FIG. 24A taken along the lines XXIVB-XXIVB'; FIG. 25B is a sectional view of the TFT array panel shown in FIG. 25A taken along the lines XXVB-XXVB', which illustrates the step following the step shown in FIG. 24B; FIG. 26B is a sectional view of the TFT array panel shown in FIG. 26A taken along the lines XXVIB-XXVIB', which illustrates the step following the step shown in FIG. 25B; FIG. 27 is a sectional view of the TFT array panel shown in FIG. 26A taken along the lines XXVIB-XXVIB', which illustrates the step following the step shown in FIG. 26B; and FIG. 28B is a sectional view of the TFT array panel shown in FIG. 28A taken along the lines XXVIIIB-XXVIIIB', which illustrates the step following the step shown in FIG. 27.

Figure 24A:
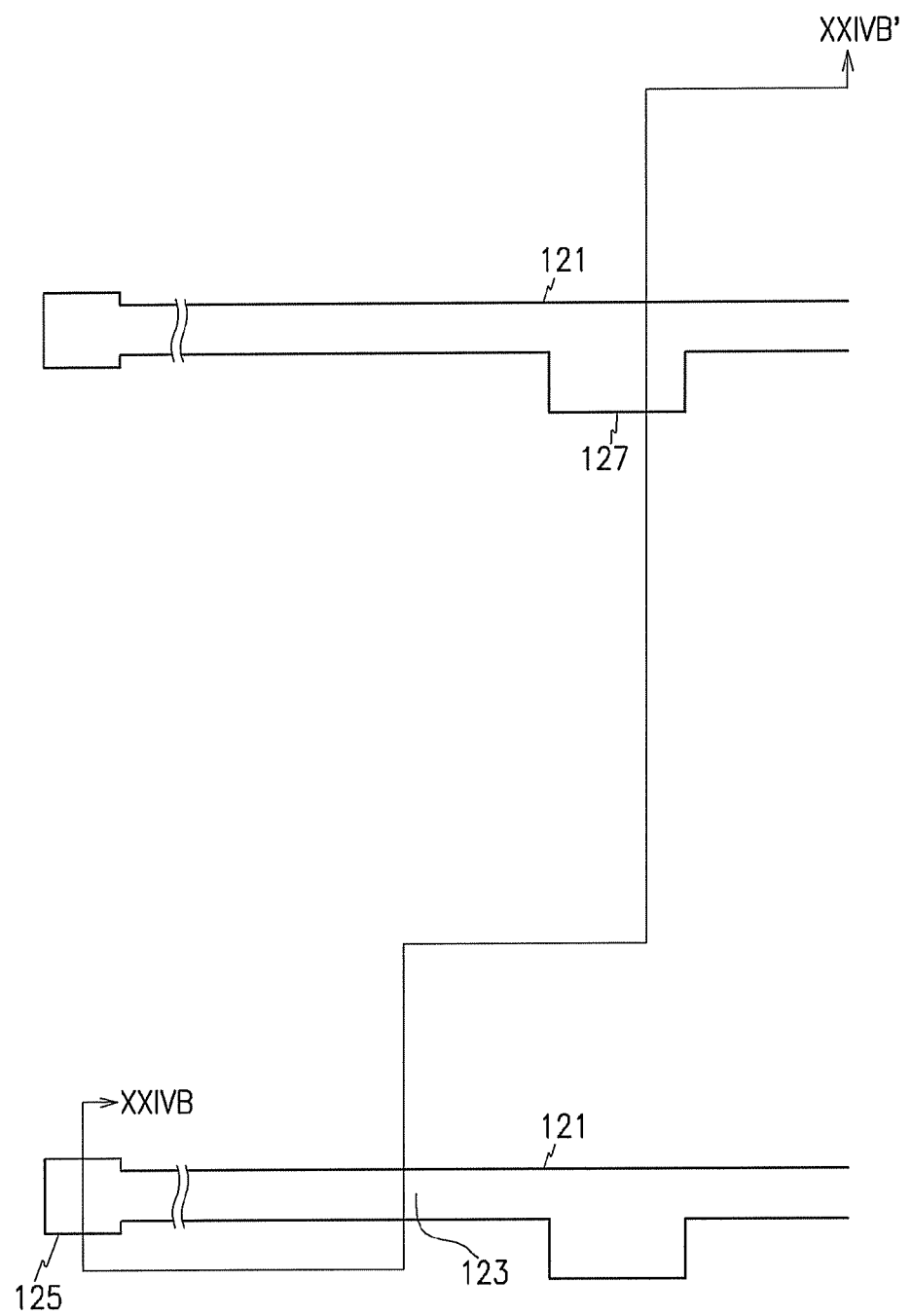
FIGS. 24A, 25A, 26A and 28A are layout views of the TFT array panel shown in FIGS. 22 and 23 in intermediate steps of a manufacturing method thereof according to an embodiment of the present invention.
Figure 24B:
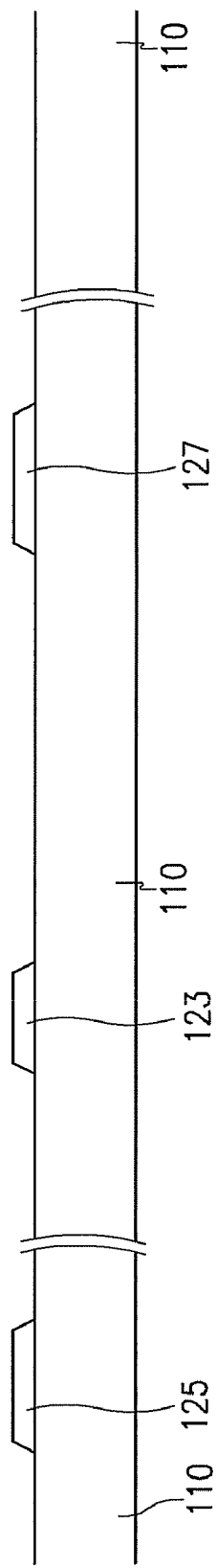
FIG. 24B is a sectional view of the TFT array panel shown in FIG. 24A taken along the lines XXIVB-XXIVB'.

Referring to FIGS. 24A and 24B, a plurality of gate lines 121 including a plurality of gate electrodes 123 and a plurality of expansions 127 are formed by photo etching on an insulating substrate 110 such as transparent glass.

After depositing a gate insulating layer 140, an intrinsic a-Si layer 150, and an extrinsic a-Si layer 160 in sequence, a lower conductive film and an upper conductive film are sequentially sputtered thereon. The lower conductive film is preferably made of Mo, Mo alloy or Cr having a good contact characteristic with IZO and ITO, and preferably has a thickness of about 500 Å. It is preferable that the upper conductive film has a thickness of about 2,500 Å, the sputtering target for the upper conductive film includes pure Al or Al—Nd containing 2 atomic % Nd, and the sputtering temperature is about 150° C.

Figure 25A:
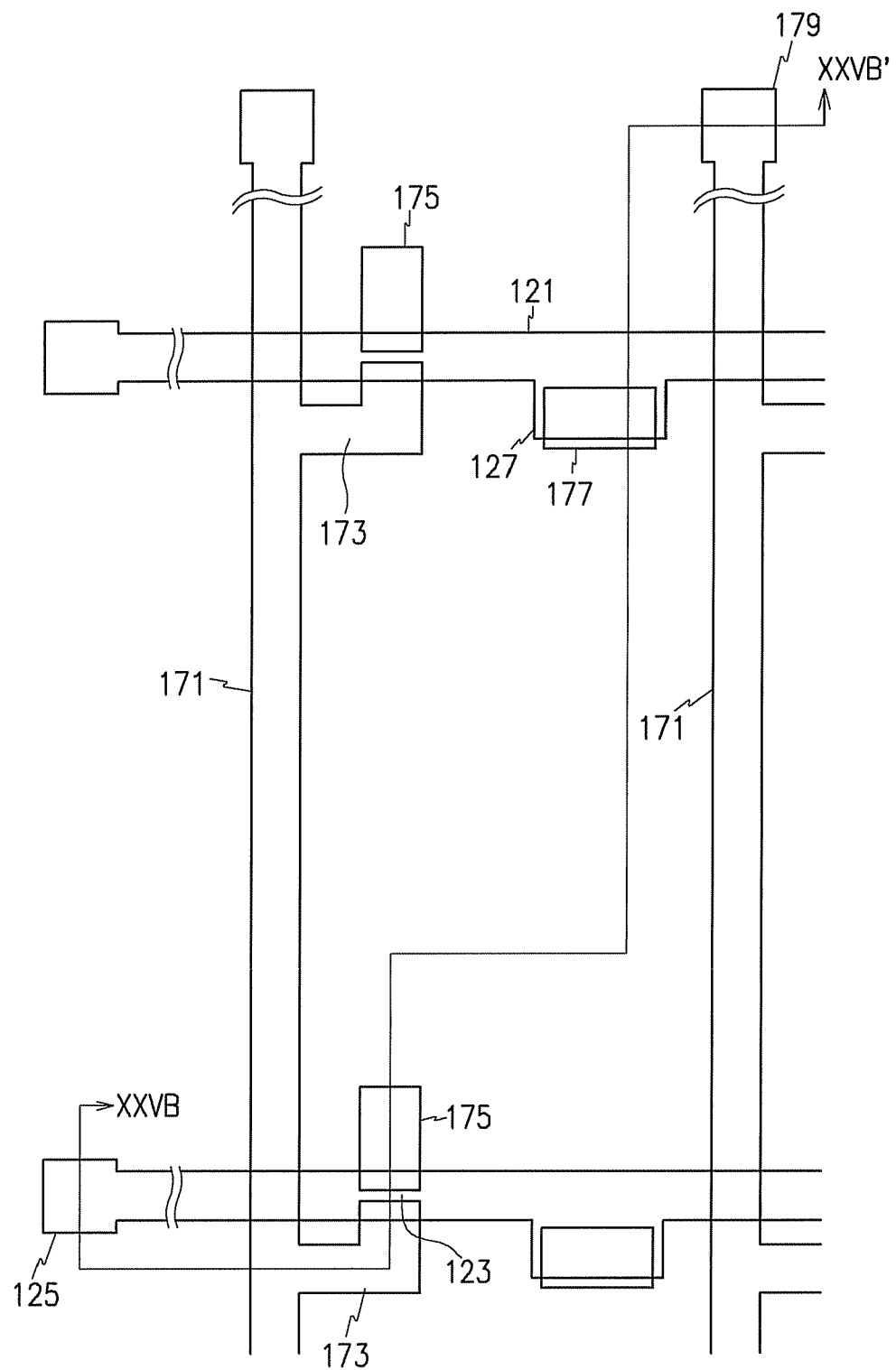
Figure 25B:
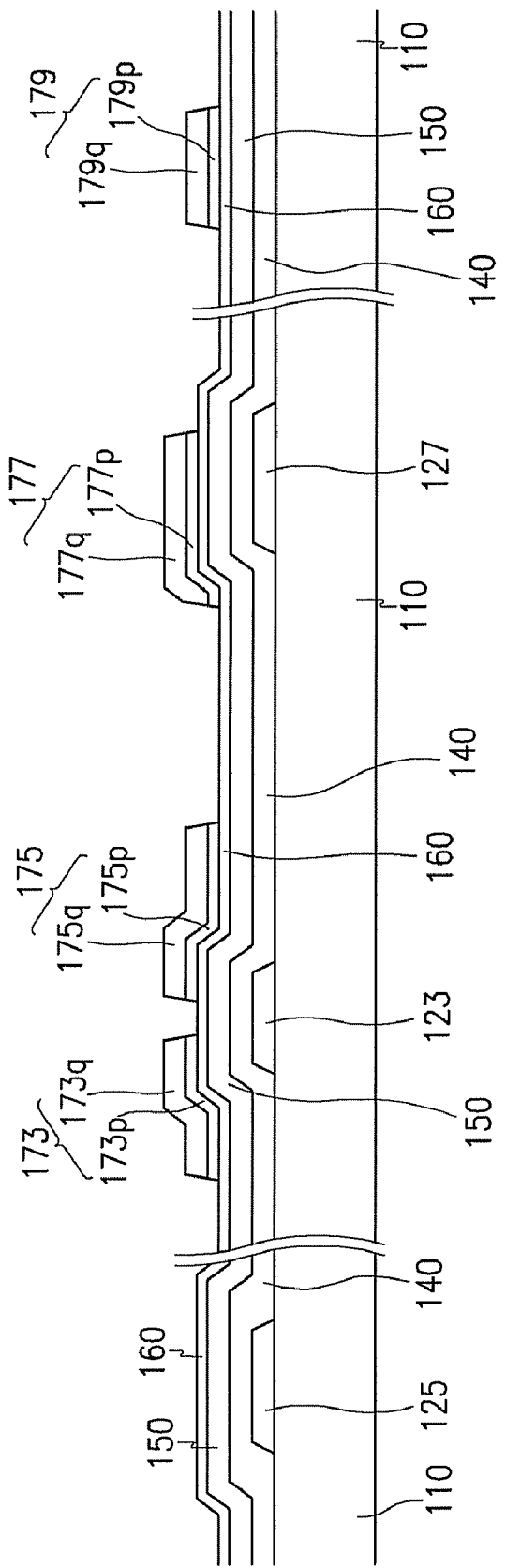
FIG. 25B is a sectional view of the TFT array panel shown in FIG. 25A taken along the lines XXVB-XXVB', which illustrates the step following the step shown in FIG. 24B.

Referring to FIGS. 25A and 25B, the upper film and the lower film are photo-etched to form a plurality of data lines 171 including a plurality of source electrodes 173, a plurality of drain electrodes 175, and a plurality of storage capacitor conductors 177, which have double-layered structures including a lower film 171p, 175p and 177p and an upper film 171q, 175q and 177q.

Figure 26A:
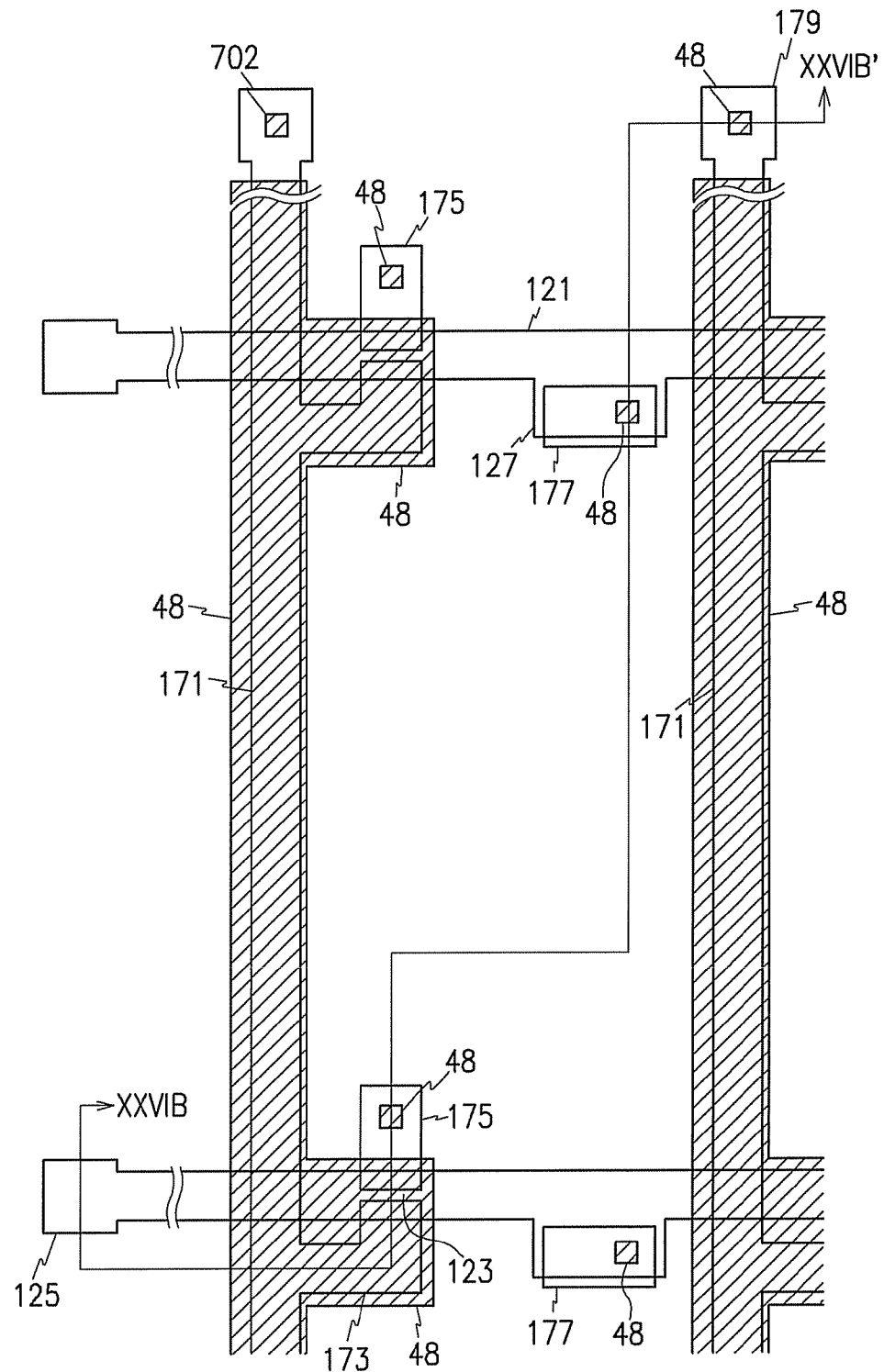
Figure 26B:
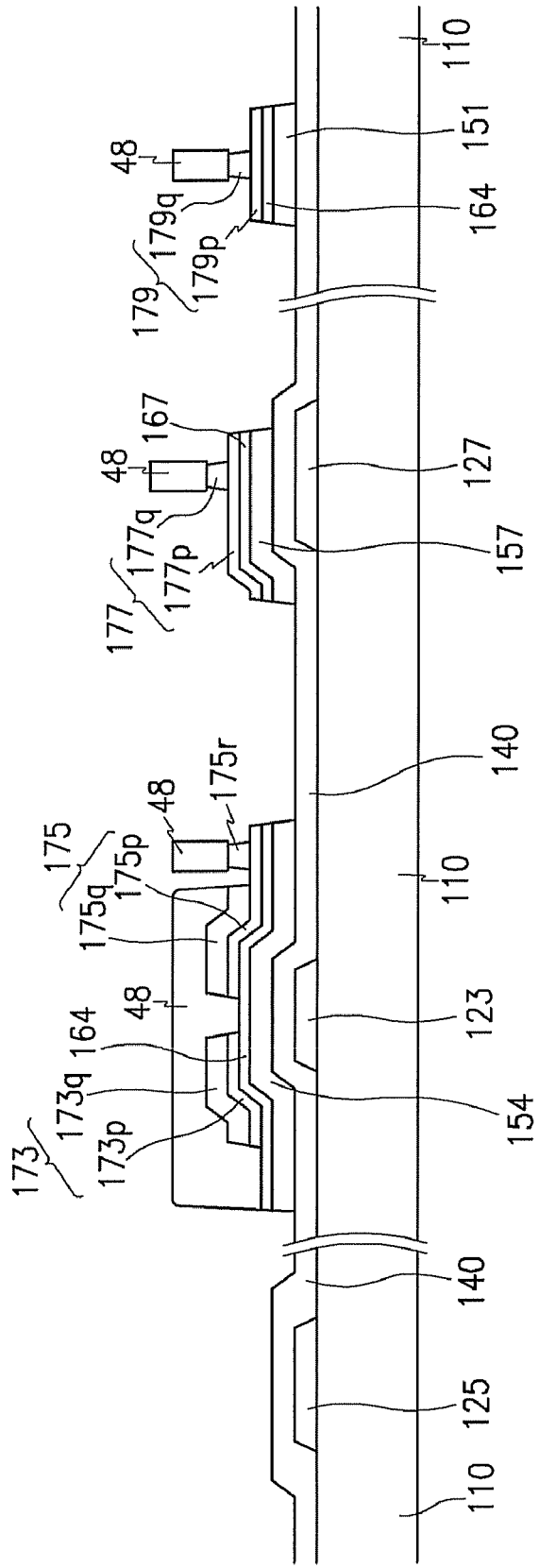
FIG. 26B is a sectional view of the TFT array panel shown in FIG. 26A taken along the lines XXVIB-XXVIB', which illustrates the step following the step shown in FIG. 25B.
Figure 27:
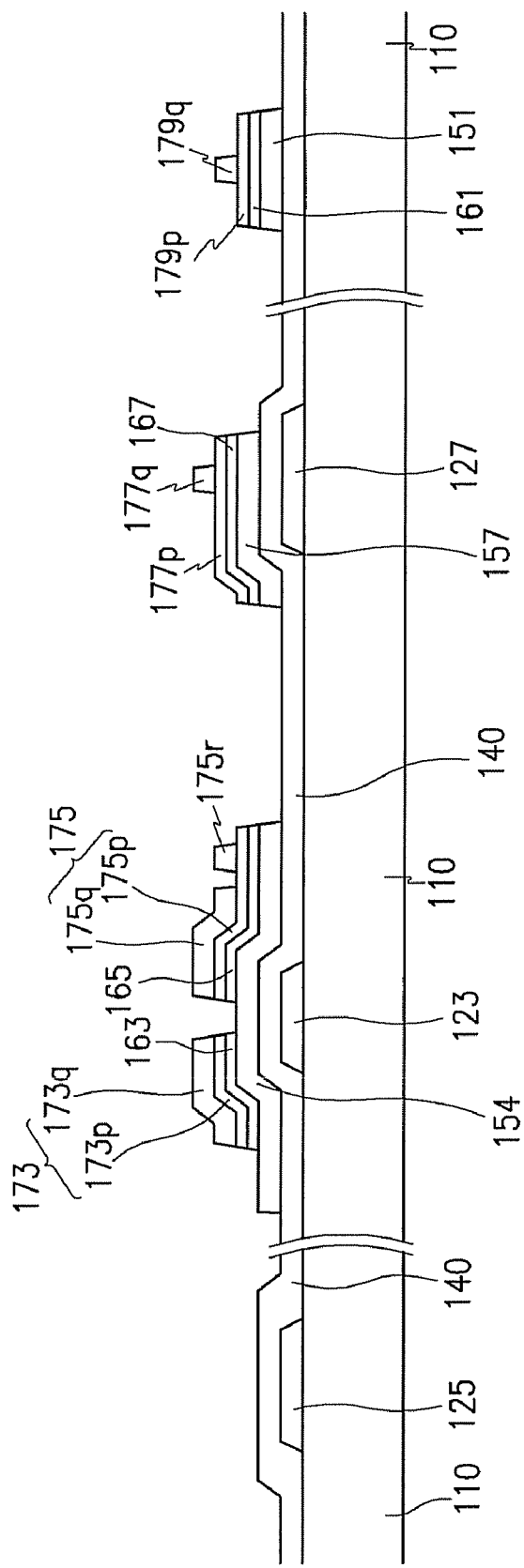
FIG. 27 is a sectional view of the TFT array panel shown in FIG. 26A taken along the lines XXVIB-XXVIB', which illustrates the step following the step shown in FIG. 26B.

After forming a photoresist 48 as shown in FIGS. 26A and 26B, exposed portions of the upper film 171q, 175q and 177q are etched out using the photoresist 48 as an etch mask. Then, a plurality of conductive islands 175q, 177q and 179q are remained on the contact portions of the drain electrodes 175, the storage capacitor conductors 177, and the data lines 171.

The extrinsic a-Si layer 160 and the intrinsic a-Si layer 150 are dry-etched using the photoresist 48 as well as the data lines 171, the drain electrodes 175, and the storage capacitor conductors 177 as an etch mask to form a plurality of extrinsic semiconductor stripes and islands 164 and 167 and a plurality of intrinsic semiconductor stripes and islands 151 and 157. After removing the photoresist 48, exposed portions of the extrinsic semiconductor stripes 164 are exposed by dry-etching to complete a plurality of ohmic contact stripes and islands 161, 165 and 167 and to expose underlying portions of the intrinsic semiconductor stripes 151 as shown in FIG. 27.

The photoresist islands 48 and the conductive islands 175q, 177q and 179q on the drain electrodes 175, the storage capacitor conductors 177, and the data lines 171 protect underlying portions of the lower film 175p, 177p and 179p from dry-etching. On the contrary, exposed portions of the lower film 175p, 177p and 179p may be etched to some degrees.

Figure 28A:
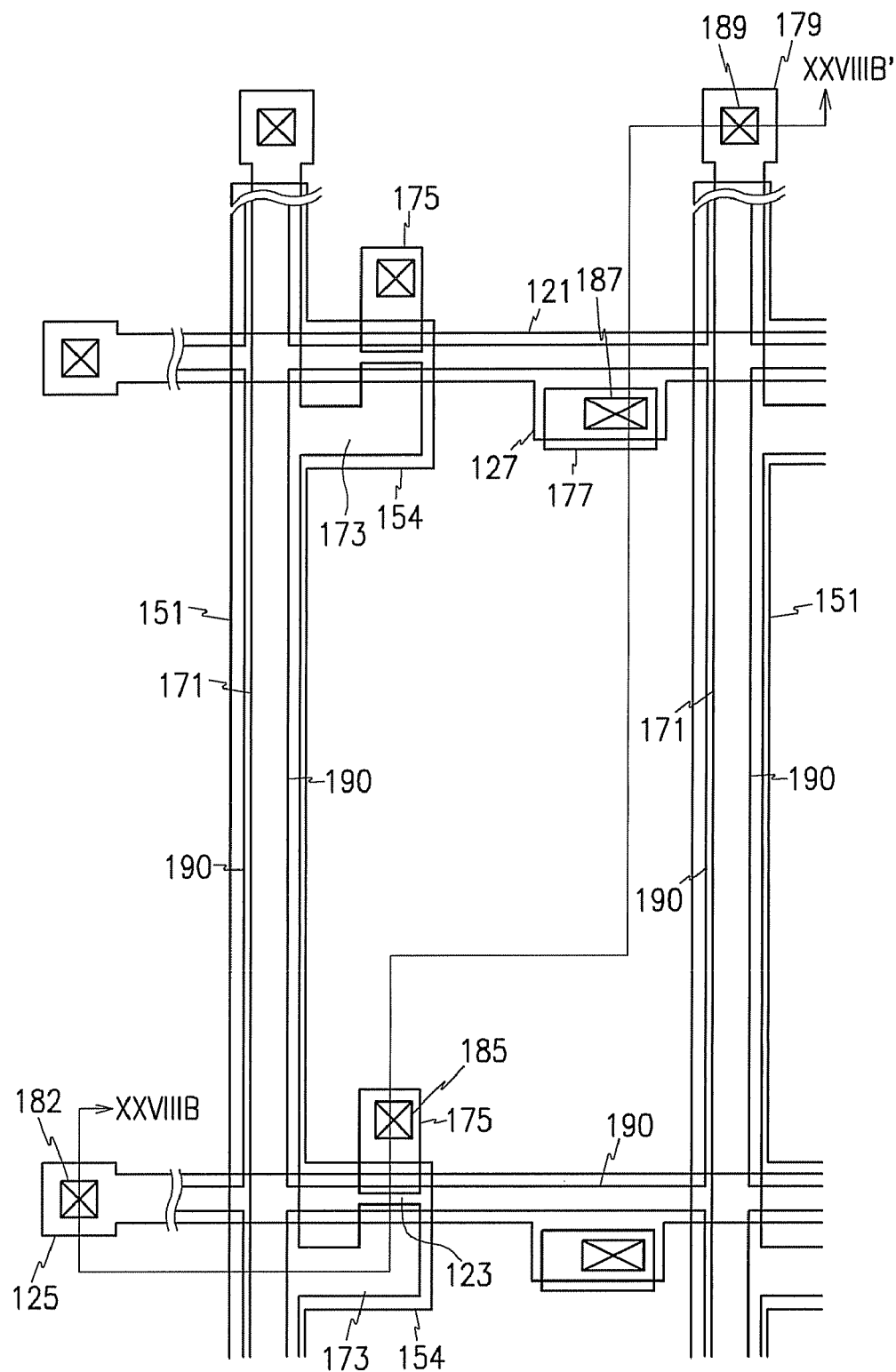
Figure 28B:
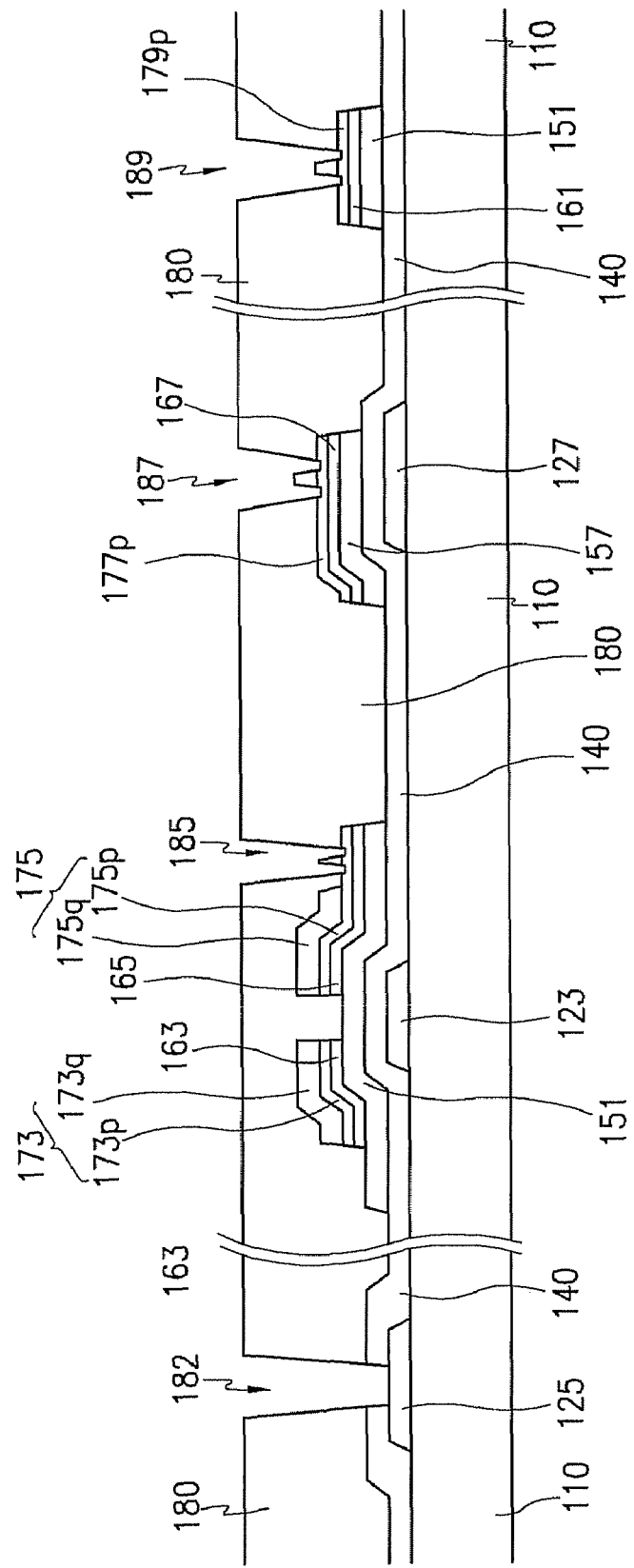
FIG. 28B is a sectional view of the TFT array panel shown in FIG. 28A taken along the lines XXVIIIB-XXVIIIB', which illustrates the step following the step shown in FIG. 27.

As shown in FIGS. 28A and 28B, after depositing a passivation layer 180, the passivation layer 180 and the gate insulating layer 140 are dry-etched using photolithography to form a plurality of contact holes 182, 185, 187 and 189 exposing end portions 125 of the gate lines 121, the drain electrodes 175, the storage capacitor conductors 177, and end portions 179 of the data lines 171, respectively. The dry-etching of the passivation layer 180 also carves out exposed portions of the lower film 175p, 177p and 179p at the contact holes 185, 187 and 189, while it cannot etch the protected portions of the lower film 175p, 177p and 179p covered with the conductive islands 175q, 177q and 179q. Accordingly, the surface of the lower film 175p, 177p and 179p has unevenness.

Subsequently, the conductive islands 175q, 177q and 179q are removed by blanket etch to expose underlying clean surface of the lower film 175p, 177p and 179p.

Finally, as shown in FIGS. 22 and 23, a plurality of pixel electrodes 190 and a plurality of contact assistants 92 and 97 are formed on the passivation layer 180.

Since the pixel electrodes 190 and the contact assistants 92 and 97 contacts the clean surface of the lower film 175p, 177p and 179p having unevenness, the contact resistance therebetween is reduced.

While the present invention has been described in detail with reference to the preferred embodiments, those skilled in the art will appreciate that various modifications and substitutions can be made thereto without departing from the spirit and scope of the present invention as set forth in the appended claims.

What is claimed is:

1. A thin film transistor away panel comprising:
   a gate conductive layer formed on an insulating substrate;
   a gate insulating layer on the gate conductive layer;
   a semiconductor layer on the gate insulating layer;
   a data conductive layer formed at least in part on the semiconductor layer and including a data line and a drain electrode separated from each other, the data conductive layer includes a lower film and an upper film, the lower film disposed between the upper film and the insulating substrate;
   a passivation layer covering the semiconductor layer; and
   a pixel electrode contacting the drain electrode,
   wherein
      at least one portion of the semiconductor layer is formed along with the data line, and
      an edge of the upper film of the drain electrode overlaps the lower film of the drain electrode, such that the lower film of the drain electrode includes a portion exposed out of the upper film of the drain electrode, and
      the pixel electrode contacts the exposed portion of the lower film of the drain electrode and is disposed spaced apart from the upper film of the drain electrode.

2. The thin film transistor array panel of claim 1, wherein the lower film and the upper film have different shapes.

3. The thin film transistor array panel of claim 2, wherein the lower film comprises a barrier metal and the upper film comprises Al or Al alloy.

4. The thin film transistor away panel of claim 1, wherein the data line has an edge substantially parallel to the semiconductor layer, the edge of the data line either placed on the semiconductor layer or coinciding with an edge of the semiconductor layer.

5. The thin film transistor away panel of claim 4, wherein the pixel electrode has an edge overlapping the gate conductive layer, the data conductive layer, or the semiconductor layer.

6. The thin film transistor array panel of claim 1, further comprising an ohmic contact interposed between the semiconductor layer and the data conductive layer and having substantially the same planar shape as the data conductive layer.

7. The thin film transistor array panel of claim 1, wherein a lateral side of the data conductive layer is tapered.

8. The thin film transistor away panel of claim 1, wherein the passivation layer has a first contact hole for contact between the drain electrode and the pixel electrode, a second contact hole exposing a portion of the gate conductive layer, and a third contact hole exposing a portion of the data line, and further comprising:
   a first contact assistant contacting the gate conductive layer through the second contact hole and a second contact assistant contacting the data line through the third contact hole, the first and the second contact including the same layer as the pixel electrode.

9. The thin film transistor away panel of claim 8, wherein the passivation layer contacts the lower film near the first and the second contact holes.

10. The thin film transistor away panel of claim 1, wherein a portion of the drain electrode contacting the pixel electrode has unevenness.

* * * * *